US011366384B2

(12) United States Patent
Cherala et al.

(10) Patent No.: US 11,366,384 B2
(45) Date of Patent: Jun. 21, 2022

(54) NANOIMPRINT LITHOGRAPHY SYSTEM AND METHOD FOR ADJUSTING A RADIATION PATTERN THAT COMPENSATES FOR SLIPPAGE OF A TEMPLATE

(71) Applicant: CANON KABUSHIKI KAISHA, Tokyo (JP)

(72) Inventors: Anshuman Cherala, Austin, TX (US); Nilabh K. Roy, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 386 days.

(21) Appl. No.: 16/719,280

(22) Filed: Dec. 18, 2019

(65) Prior Publication Data

US 2021/0191256 A1 Jun. 24, 2021

(51) Int. Cl.
*G03F 7/00* (2006.01)
*B29C 35/08* (2006.01)
*B82Y 40/00* (2011.01)
*B82Y 10/00* (2011.01)
*B81C 1/00* (2006.01)

(52) U.S. Cl.
CPC ........ *G03F 7/0002* (2013.01); *B29C 35/0805* (2013.01); *B81C 1/0046* (2013.01); *B82Y 10/00* (2013.01); *B82Y 40/00* (2013.01); *B29C 2035/0833* (2013.01)

(58) Field of Classification Search
CPC ...... B29C 59/02; B29C 59/022; G03F 7/0002
See application file for complete search history.

(56) References Cited

U.S. PATENT DOCUMENTS

| 5,912,773 | A  | * | 6/1999  | Barnett ............... H04N 9/28 359/822 |
| 6,936,194 | B2 |   | 8/2005  | Watts |
| 7,157,036 | B2 |   | 1/2007  | Choi et al. |
| 8,066,930 | B2 |   | 11/2011 | Sreenivasan et al. |
| 8,076,386 | B2 |   | 12/2011 | Xu et al. |
| 8,349,241 | B2 |   | 1/2013  | Sreenivasan et al. |
| 2009/0200710 | A1 |   | 8/2009 | Khusnatdinov et al. |
| 2010/0096764 | A1 |   | 4/2010 | Lu |
| 2019/0101823 | A1 |   | 4/2019 | Patel et al. |

FOREIGN PATENT DOCUMENTS

WO   2019078060 A1   4/2019

\* cited by examiner

*Primary Examiner* — James Sanders
(74) *Attorney, Agent, or Firm* — Daniel Ratoff

(57) ABSTRACT

Methods and systems for imprinting, including receiving template slippage data about a change in a position of a template relative to a reference position. Also, a desired actinic radiation pattern to expose formable material in an imprinting field under a template border region of the template may be received. In addition, a new actinic radiation pattern to expose the template border region that compensates for the template slippage may be determined. The formable material in the imprinting field on the substrate may be contacted with the template. The template border region may be exposed to the new actinic radiation pattern while the template is in contact with the formable material.

19 Claims, 13 Drawing Sheets

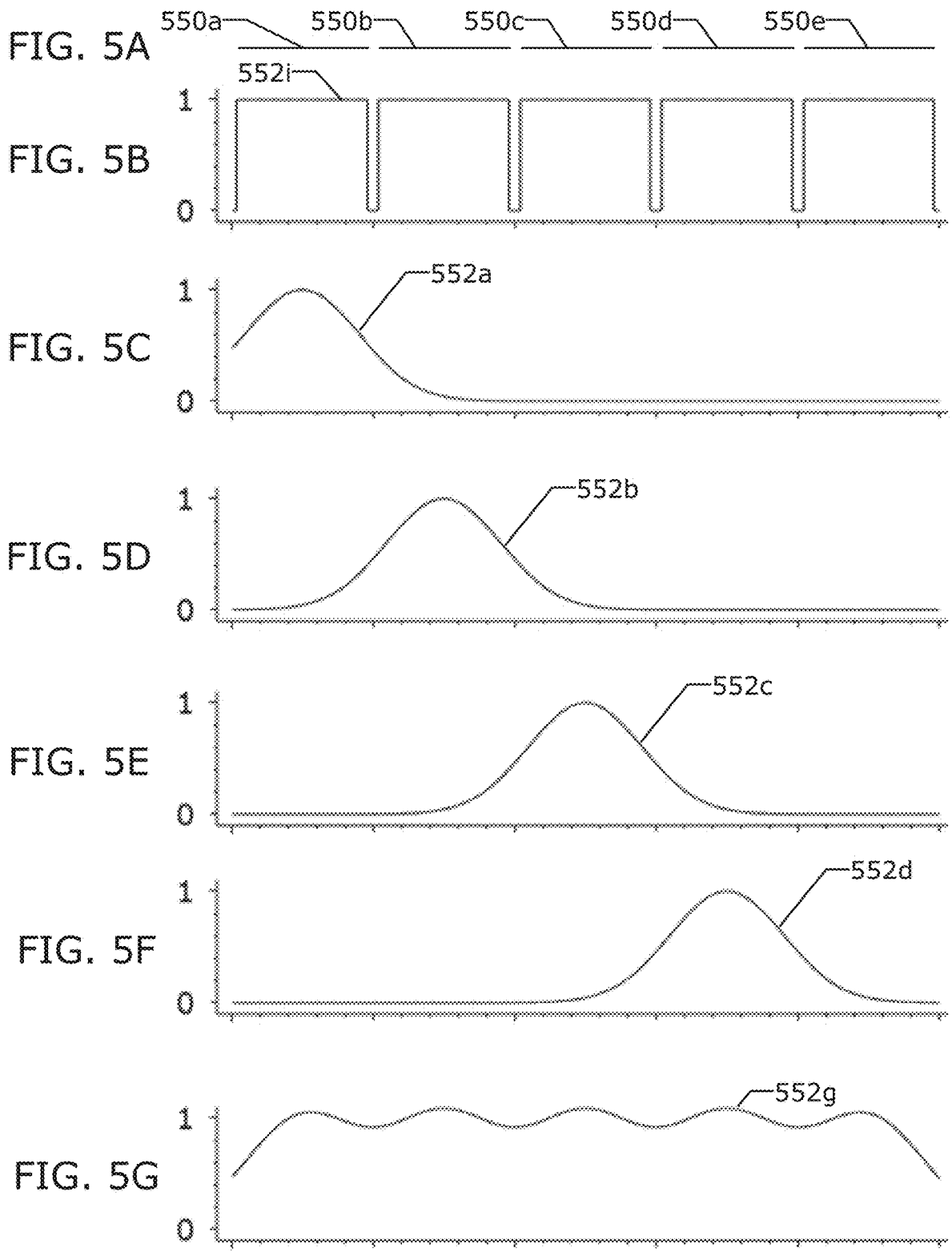

M₀

| n\m | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 0 | 0 | 0 | 0 |
| 1 | 0 | 0.41 | 1 | 1 | 1 | 1 | 1 | 0.70 | 0 | 0 |
| 2 | 0 | 0.38 | 1 | 1 | 1 | 1 | 1 | 0.56 | 0 | 0 |
| 3 | 0 | 0.35 | 1 | 0 | 0 | 0 | 1 | 0.67 | 0 | 0 |
| 4 | 0 | 0.37 | 1 | 0 | 0 | 0 | 1 | 0.76 | 0 | 0 |
| 5 | 0 | 0.44 | 1 | 0 | 0 | 0 | 1 | 0.63 | 0 | 0 |
| 6 | 0 | 0.48 | 1 | 1 | 1 | 1 | 1 | 0.73 | 0 | 0 |
| 7 | 0 | 0.51 | 0.54 | 0.60 | 0.57 | 0.59 | 0.71 | 0.78 | 0 | 0 |
| 8 | 0 | 0 | 0 | 0 | 0 | 0 | 0 | 0 | 0 | 0 |

| n\m | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 0 | 0 | 0 | 0 |
| 1 | 0 | 0 | 0.41 | 1 | 1 | 1 | 1 | 1 | 0.70 | 0 |
| 2 | 0 | 0 | 0.38 | 1 | 1 | 1 | 1 | 1 | 0.56 | 0 |
| 3 | 0 | 0 | 0.35 | 1 | 0 | 0 | 0 | 1 | 0.67 | 0 |
| 4 | 0 | 0 | 0.37 | 1 | 0 | 0 | 0 | 1 | 0.76 | 0 |
| 5 | 0 | 0 | 0.44 | 1 | 0 | 0 | 0 | 1 | 0.63 | 0 |
| 6 | 0 | 0 | 0.48 | 1 | 1 | 1 | 1 | 1 | 0.73 | 0 |
| 7 | 0 | 0 | 0.51 | 0.54 | 0.60 | 0.57 | 0.59 | 0.71 | 0.78 | 0 |
| 8 | 0 | 0 | 0 | 0 | 0 | 0 | 0 | 0 | 0 | 0 |

| n\m | 0 | 1 | 2 | 3 | 4 | 5 | 6 | 7 | 8 | 9 |
|---|---|---|---|---|---|---|---|---|---|---|
| 0 | 0 | 0 | 0 | 0 | 0 | 0 | 0 | 0 | 0 | 0 |
| 1 | 0 | 0 | 0.11 | 1 | 1 | 1 | 1 | 1 | 1.00 | 0 |
| 2 | 0 | 0 | 0.08 | 1 | 1 | 1 | 1 | 1 | 0.86 | 0 |
| 3 | 0 | 0 | 0.05 | 1 | 0.30 | 0 | 0 | 0.70 | 0.97 | 0 |
| 4 | 0 | 0 | 0.06 | 1 | 0.30 | 0 | 0 | 0.70 | 1 | 0.06 |
| 5 | 0 | 0 | 0.14 | 1 | 0.30 | 0 | 0 | 0.70 | 0.94 | 0 |
| 6 | 0 | 0 | 0.17 | 1 | 1 | 1 | 1 | 1 | 1 | 0 |
| 7 | 0 | 0 | 0.21 | 0.54 | 0.60 | 0.57 | 0.59 | 0.71 | 1 | 0.08 |
| 8 | 0 | 0 | 0 | 0 | 0 | 0 | 0 | 0 | 0 | 0 |

NANOIMPRINT LITHOGRAPHY SYSTEM AND METHOD FOR ADJUSTING A RADIATION PATTERN THAT COMPENSATES FOR SLIPPAGE OF A TEMPLATE

BACKGROUND OF INVENTION

Technical Field

The present disclosure relates to a nanoimprint lithography system and method for adjusting a radiation pattern used for curing that compensates for slippage of a template.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate. The formable liquid is applied onto the substrate. The template is brought into contact with the formable liquid causing the formable liquid to spread and fill the space between the template and the substrate. The formable liquid is solidified to form a film that has a shape (pattern) conforming to a shaping surface of the template. After solidification, the template is separated from the solidified layer such that the template and the substrate are spaced apart.

The substrate and the solidified layer may then be subjected to known steps and processes for device (article) fabrication, including, for example, curing, oxidation, layer formation, deposition, doping, planarization, etching, formable material removal, dicing, bonding, and packaging, and the like. For example, the pattern on the solidified layer may be subjected to an etching process that transfers the pattern into the substrate.

SUMMARY OF THE INVENTION

A first embodiment, may be a method of imprinting. The method of imprinting may comprise receiving template slippage data about a change in a position of a template relative to a reference position. The method of imprinting may further comprise receiving a desired actinic radiation pattern to expose formable material in an imprinting field under a template border region of the template. The method of imprinting may further comprise determining a new actinic radiation pattern to expose the template border region that compensates for the template slippage. The method of imprinting may further comprise contacting the formable material in the imprinting field on the substrate with the template. The method of imprinting may further comprise exposing the template border region to the new actinic radiation pattern while the template is in contact with the formable material.

The first embodiment, may further comprise sending the new actinic radiation pattern to a spatial light modulator as a map of modulation values.

In an aspect of the first embodiment, the spatial light modulator may be positioned in a fixed position relative to a template chuck configured to hold the template during the method of imprinting.

In an aspect of the first embodiment, each element in the map of modulation values may be associated with a corresponding modulation element of the spatial light modulator.

In an aspect of the first embodiment, the spatial light modulator may include a digital micromirror device. Each element in the map of modulation values may include a modulation duty cycle that is representative of a period of time during which an individual mirror on the digital micromirror device guides actinic radiation towards formable material under the template.

In an aspect of the first embodiment, the spatial light modulator may include a transmissive spatial intensity modulator. Each element in the map of modulation values may include one or both of a modulation duty cycle and a specified transmissivity. A period during which an individual modulation element of the transmissive spatial intensity modulator transmits with the specified transmissivity of actinic radiation that is guided towards formable material under the template may be determined by the corresponding element of the map of modulation values.

In an aspect of the first embodiment, wherein the transmissive spatial intensity modulator may include: a liquid crystal polarization retarder; and a polarizer.

In an aspect of the first embodiment, the spatial light modulator may include a reflective spatial intensity modulator. Each element in the map of modulation values may include one or both of a modulation duty cycle and a specified reflectance. A period of during which an individual modulation element of the reflective spatial intensity modulator reflects with the specified reflectance of actinic radiation that is guided towards formable material under the template is determined by the corresponding element of the map of modulation values.

In an aspect of the first embodiment, the reflective spatial intensity modulator may include: a liquid crystal polarization retarder on silicon with a reflective coating; and a polarizer.

In an aspect of the first embodiment, the formable material forms a cured film when exposed to actinic radiation.

In an aspect of the first embodiment, the method may also be used for manufacturing articles. The method of manufacturing articles may further comprise processing a substrate on which the cured film is formed so as to manufacture the articles.

The first embodiment, may further comprise exposing at least a central region of the template to a first distribution of a dosage of actinic radiation while also exposing the template border region to the new actinic radiation pattern. Determining the new actinic radiation pattern may include considering the first distribution of the dosage of actinic radiation.

In an aspect of the first embodiment, determining the new actinic radiation pattern may comprise: determining a set of transformation parameters based on: the template slippage data; an x-axis projected pitch; and a y-axis projected pitch. Determining the new actinic radiation pattern may further comprise generating a new map of modulation values that is representative of the new actinic radiation pattern based on the set of transformation parameters.

In an aspect of the first embodiment, the desired actinic radiation pattern maybe represented by an initial map of modulation values. The set of transformation parameters may include: a y-axis full pitch transformation parameter; and an x-axis full pitch transformation parameter. Generating the new map of modulation values may include shifting the initial map of modulation values in accordance with the set of transformation parameters.

In an aspect of the first embodiment, the desired actinic radiation pattern may be represented by an initial map of modulation values. The set of transformation parameters may include: a y-axis partial pitch transformation parameter; and an x-axis partial pitch transformation parameter. Generating the new map of modulation values may include adding and subtracting in accordance with the set of transformation parameters from one or more subsets of a selected modulation map selected from: the initial map of modulation values; and a shifted initial map of modulation values.

In an aspect of the first embodiment, each subset in the one or more subsets may include two or more elements of the selected modulation map.

In an aspect of the first embodiment, determining the new actinic radiation pattern may include calculating an interpolated map of modulation values based on the template slippage data and at least two maps of modulation values. The interpolated map of modulation values may be sent to a spatial light modulator to generate the new actinic radiation pattern.

In an aspect of the first embodiment, the template slippage data may include information about the change in the position of the template from at least two different times. Determining the new actinic radiation pattern may include estimating a predicted position of the template when the template border region is exposed to actinic radiation based on the template slippage data. Determining the new actinic radiation pattern may also include calculating a new map of modulation values based on predicted position of the template. The new map of modulation values may be sent to a spatial light modulator to generate the new actinic radiation pattern.

A second embodiment, may be a system comprising: a memory; and a processor. The processor may be configured to receive template slippage data about a change in a position of a template relative to a reference position. The processor may be further configured to receive a desired actinic radiation pattern to expose formable material in an imprinting field under a template border region of the template. The processor may be further configured to determine a new actinic radiation pattern to expose the template border region that compensates for the template slippage. The processor may be further configured to send instructions for the system to bring the formable material in the imprinting field on the substrate into contact with the template. The processor may be further configured to send instructions for the system to expose the template border region to the new actinic radiation pattern while the template is in contact with the formable material.

The second embodiment, may further comprise a nanoimprint lithography system. The nanoimprint lithography system may include a spatial light modulator configured to receive a map of modulation values that are representative of the new actinic radiation pattern. The nanoimprint lithography system may further include a source of actinic radiation configured to illuminate the spatial light modulator with actinic radiation. The nanoimprint lithography system may further include a template chuck configured to hold the template. The nanoimprint lithography system may further include a sensor configured to measure template slippage data and send the template slippage data to the processor. The nanoimprint lithography system may further include a positioning system configured to bring the formable material in the imprinting field on the substrate into contact with the template.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIG. 5A is an illustration of a set of modulation elements in a spatial light modulator as might be used in an embodiment.

FIGS. 5B-G are illustrations of actinic radiation patterns as used in embodiments.

FIGS. 8A-E are illustrations of modulation maps as used in an embodiment.

Figure 1:
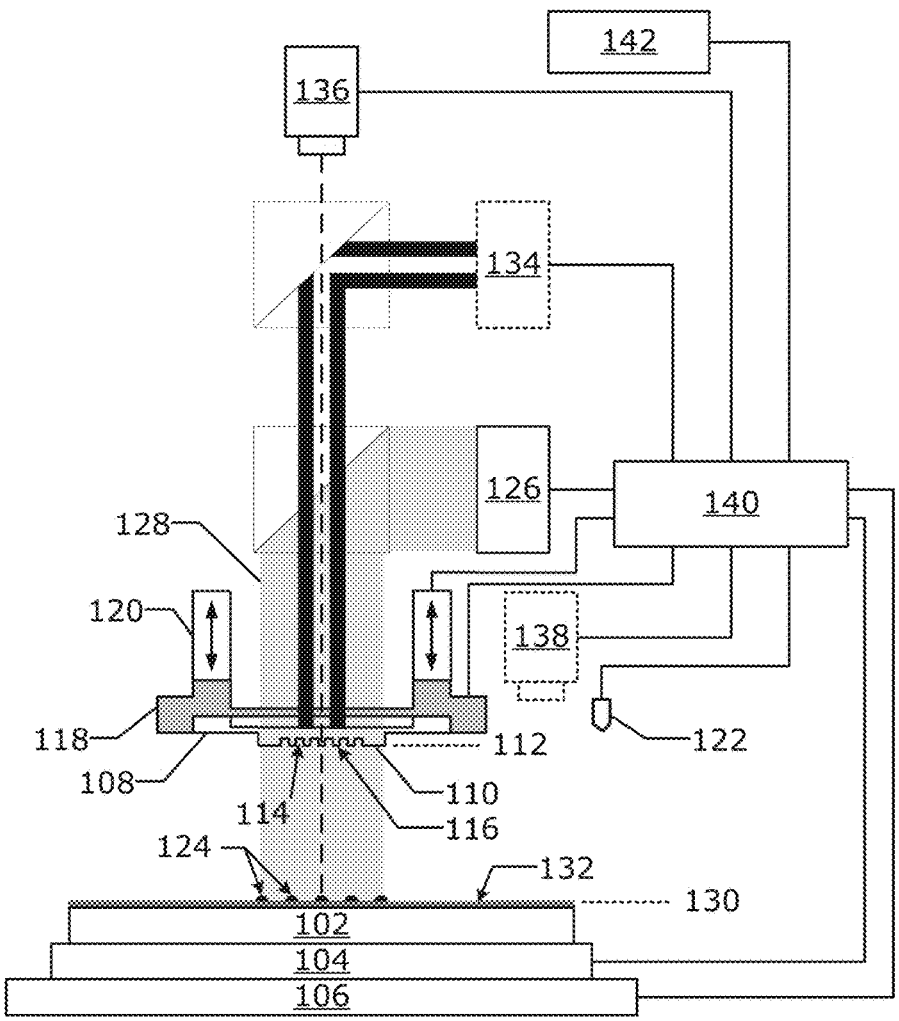
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprinting lithography technique can be used to shape a film on a substrate from a formable material. The shaping process includes bringing a template into contact with the formable material. The template includes a shaping surface on a mesa that extends above a recessed surface. The template also includes mesa sidewalls that surround the mesa and connect the shaping surface to the recessed surface. During the shaping process the formable material spreads due to capillary action and other forces such that the formable material spreads toward the mesa sidewalls. This shaping process is done repeatedly across multiple shaping fields and across multiple substrates.

Extrusion defects can form when formable material wets the mesa sidewalls during the shaping process. After the formable material is exposed to actinic radiation, and the template separates from the formable material, one or more extrusion defects may stay on the substrate and/or template. Non-fill defects can form when the formable material does not reach the edge of the mesa or does not fill features within the template.

The applicant has found that depending on the size tolerance (from a few 100 nm-tens of µm), these defects do not always occur in a repeatable manner (for very small defects) but have a stochastic component. The applicant has found that it is advantageous to minimize the occurrence of both extrusions and non-fill defects to improve yield in the overall article manufacturing process.

The applicant has found that extrusion defects can be reduced if the amount of actinic radiation supplied near the mesa sidewalls is carefully controlled.

The applicant has found that the position of the template can shift relative to other components in the shaping system. This can make it difficult to control the amount of actinic radiation supplied near the mesa sidewalls. What is needed are systems and/or methods that allow for control the amount of actinic radiation supplied near the mesa sidewalls that also compensates for shift of the template.

Nanoimprint System (Shaping System)

FIG. 1 is an illustration of a nanoimprint lithography system 100 in which an embodiment may be implemented. The nanoimprint lithography system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. The patterning surface 112, also known as a shaping surface, is the surface of the template that shapes the formable material 124. In an embodiment, the patterning surface 112 is planar and is used to planarize the formable material. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting process. The field camera 136 may also be configured to measure interference fringes, which change as the formable material spreads 124 between the gap between the patterning surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system 36 may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124, forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form a planar layer with a featureless patterning surface 112.

The imprinting process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template

Figure 2:
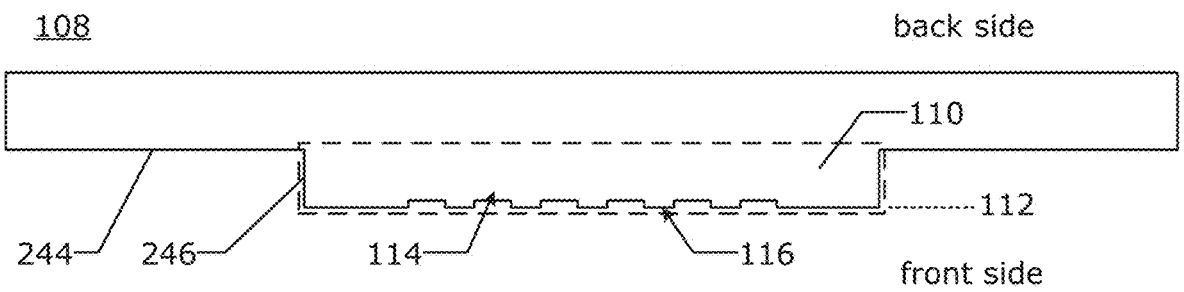
FIG. 2 is an illustration of an exemplary template that may be used in an embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Imprinting Process

Figure 3:
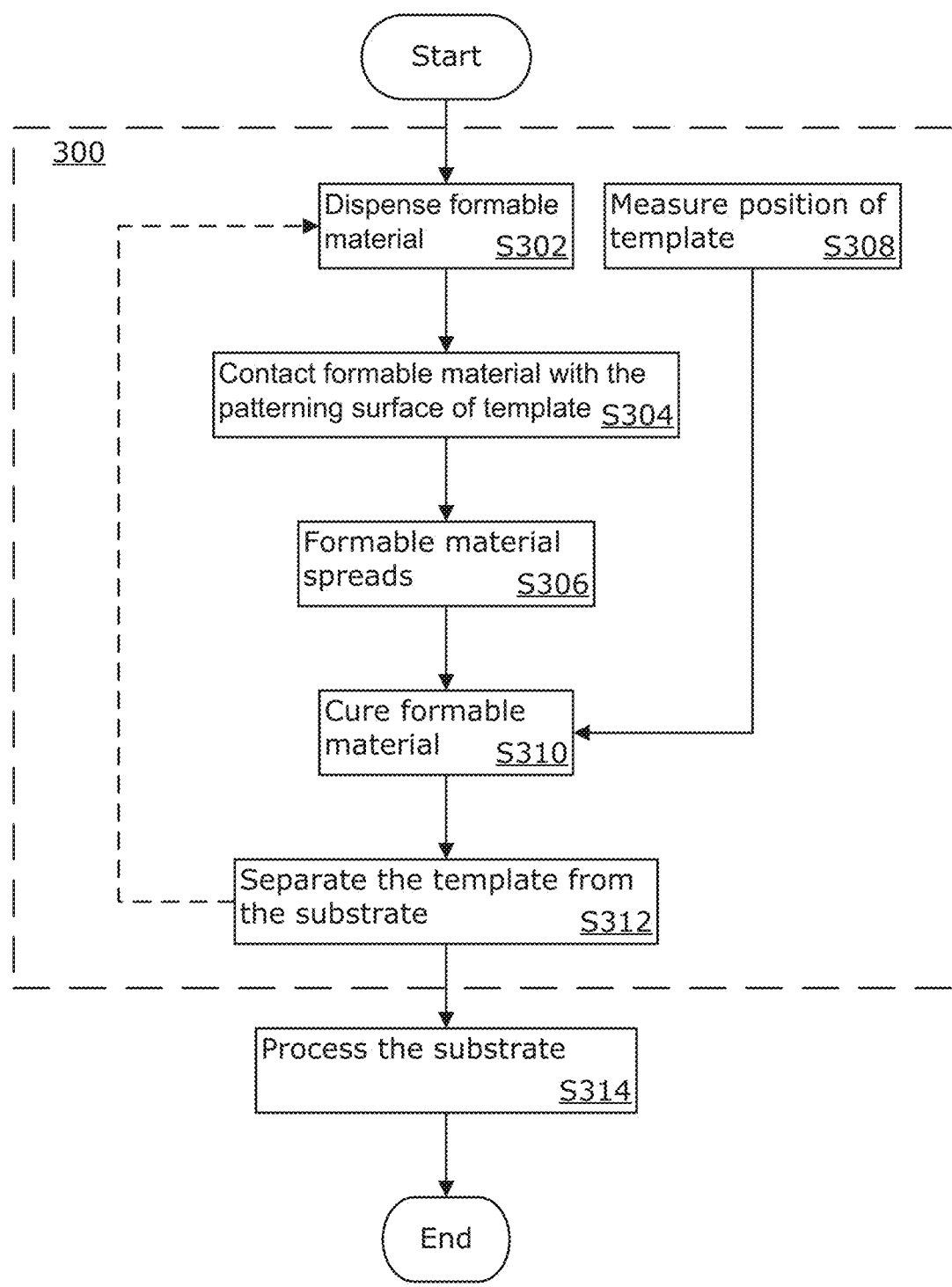
FIG. 3 is a flowchart illustrating an exemplary imprinting method as used in an embodiment.

FIG. 3 is a flowchart of a method of manufacturing an article (device) that includes an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control the imprinting process 300.

In an alternative embodiment, the imprinting process 300 is used to planarize the substrate 102. In which case, the patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc. {N∈Z$^+$}. In a dispensing step S302, the processor 140 may cause the fluid dispenser 122 to dispense formable material onto an imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a measurement step S308 the position of the template 108 is measured. The position of the template 108 may be measured with a sensor that can measure the relative or absolute position of the template 108 using a sensor such as a spectral interference displacement sensor. Multiple sensors may be used to measure the position of the template 108. The position of the template 108 may include one or more coordinates along orthogonal axis (x, y, z) and/or one or more coordinates along rotation axis (θ, φ, ψ). In an embodiment, there may be a sensor for each coordinate. A relative position of the template may be relative to one of: an initial set position, a position on the template chuck 118, a position of the sensor, etc.

In a curing step S310, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112. In an embodiment, the illumination pattern may be adjusted based on changes in the position of the template as measured in the measurement step S308.

In a separation step S312, the processor 140 uses one or more of the substrate chuck 104, the substrate positioning stage 106, template chuck 118, and the imprint head 120 to separate the patterning surface 112 of the template 108 from the cured formable material on the substrate 102. If there are additional imprint fields to be imprinted, then the process moves back to step S302.

In an embodiment, after the imprinting process 300 is finished additional semiconductor manufacturing processing is performed on the substrate 102 in a processing step S314 so as to create an article of manufacture (e.g. semiconductor device). In an embodiment, each imprint field includes a plurality of devices.

The further semiconductor manufacturing processing in processing step S314 may include etching processes to transfer a relief image into the substrate that corresponds to the pattern in the patterned layer or an inverse of that pattern. The further processing in processing step S314 may also include known steps and processes for article fabrication, including, for example, inspection, curing, oxidation, layer formation, deposition, doping, planarization, etching, formable material removal, dicing, bonding, packaging, and the like. The substrate 102 may be processed to produce a plurality of articles (devices).

Details of Imprinting System with a Spatial Light Modulator

Figure 4A:
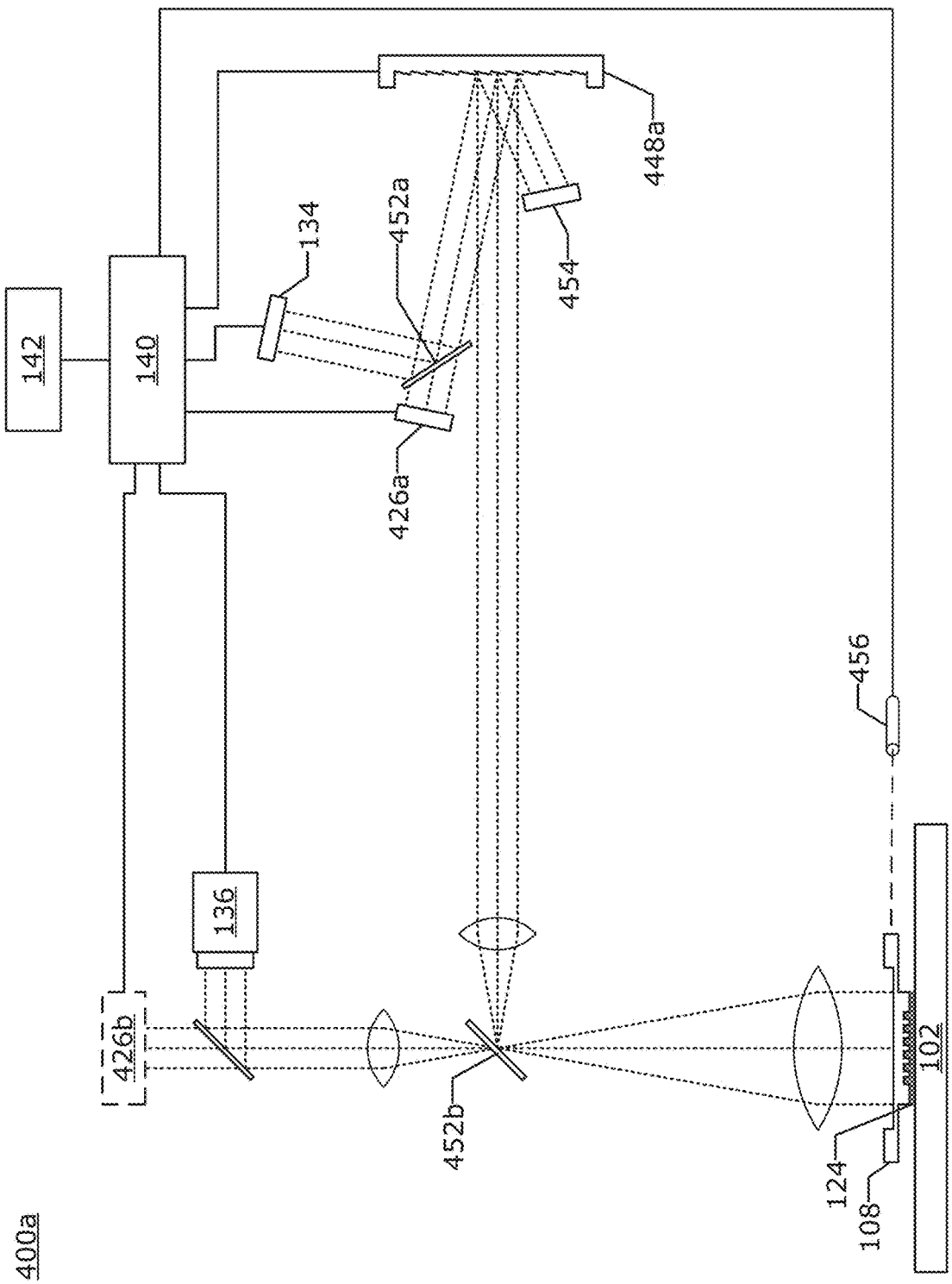
FIGS. 4A-C are illustrations of particular components of an exemplary imprinting method as used in embodiments.

FIG. 4A is an illustration of a nanoimprint lithography system 400a that is substantially similar to the nanoimprint lithography system 100 illustrated in FIG. 1 in which a spatial light modulator 448a is explicitly shown. The order, arrangement, and use of optical components such as light sources, beam splitters, lenses, and mirrors as illustrated in FIG. 4A are exemplary and other arrangements of optical components can be used to carry out an embodiment.

The nanoimprint lithography system 400a may include a first source of actinic radiation 426a. The first source of actinic radiation 426a may include be a laser, LED, or a lamp. The first source of actinic radiation 426a is positioned to illuminate the spatial light modulator 448. One or more optical components may be arranged to guide the actinic radiation to the spatial light modulator 448. The first source of actinic radiation 426a may receive one or more signals from the processor 140 with instruction on when and how much actinic radiation to provide.

The spatial light modulator 448 may be a digital micromirror device (DMD) 448a, Liquid Crystal Device (LCD) 448b, Liquid Crystal on Silicon (LCoS) 448c, spatial light valve, mirror array, MOEMS, diffractive MEMS, etc., to modulate the spatio-temporal distribution of actinic radiation from the first actinic radiation source 426a. The spatial light modulator 448 may also be configured to irradiate one or more of the substrates 102, the template 108, and/or the formable material 124 with radiation from a thermal radiation source 134. A beam combiner 452a may be used combine thermal radiation from the thermal radiation source 134 and the actinic radiation from the first actinic radiation source 426a.

The spatial light modulator 448 may include a plurality of modulation elements tessellated across the spatial light modulator 448. Each modulation element may be individually addressable in both space and time. The processor 140 may be configured to send a first set of signals to the spatial light modulator 448 based on a map of modulation values received from the memory 142. In response to the first set of signals the spatial light modulator 448 will change the state of individual modulation elements in the spatial light modulator. In an embodiment, the map is information indicating on/off status of each modulation element of the spatial light modulator 448. In an embodiment, the map is information indicating the status of each modulation element of the spatial light modulator 448. In which the status includes one or more of: on/off status; on/off status duration; amount reflected (for reflective LCD); amount transmitted (for transmitted LCD).

The map may be represented by a matrix M with M rows and N columns. Each element M(row m, column n) corresponds to a modulation element of the SLM 448. Each element M(m,n) also corresponds to a region on the plane of the formable material during the curing step S310. A position on the plane of the formable material is represented by a position (x,y). In the following discussion each row m corresponds to a position y on a y-axis at the plane of the formable material. In the following discussion each row n corresponds to a position x on an x-axis at the plane of the formable material. In the following discussion each positive increment in an index m corresponds to a positive shift by a y-axis projected pitch ($p_y$) along the y-axis at the plane of the formable material. In the following discussion each positive increment in an index n corresponds to a positive shift by an x-axis projected pitch ($p_x$) along the x-axis at the plane of the formable material. In an alternative embodiment, this positive increments in the indexes correspond to negative shifts along each axis. The relationship between the map M and template shift coordinates can be obtained by a user of the apparatus.

In the case in which the spatial light modulator 448 is a DMD 448a changing the state of a modulation element means moving a micromirror from a first angle to a second angle. In the case in which the spatial light modulator 448 is a transmissive spatial light modulator 448b, such as an LCD or a spatial light valve, changing the state of a modulation element means changing the transmissivity of the modulation element. Changing the transmissivity may include changing the state of a polarization retarder (for example a liquid crystal). The polarization retarder may include or be optically coupled to a polarizer which blocks some portion of the light. In the case in which the spatial light modulator 448 is a reflective spatial light modulator 448c, such as an LCoS, changing the state of a modulation element means changing the reflectivity of the modulation element. Changing the transmissivity may include changing the state of a polarization retarder (for example a liquid crystal) on a reflective surface. The polarization retarder may include or be optically coupled to a polarizer which blocks some portion of the light.

FIG. 4A is an illustration of an embodiment 400a in which the spatial light modulator is a DMD 448a. Individual mirrors (modulation elements) on the spatial light modulator may be in a first state that guides the actinic radiation towards the template or in a second state that guides the actinic radiation away from the template for example towards a beam dump 454.

Figure 4B:
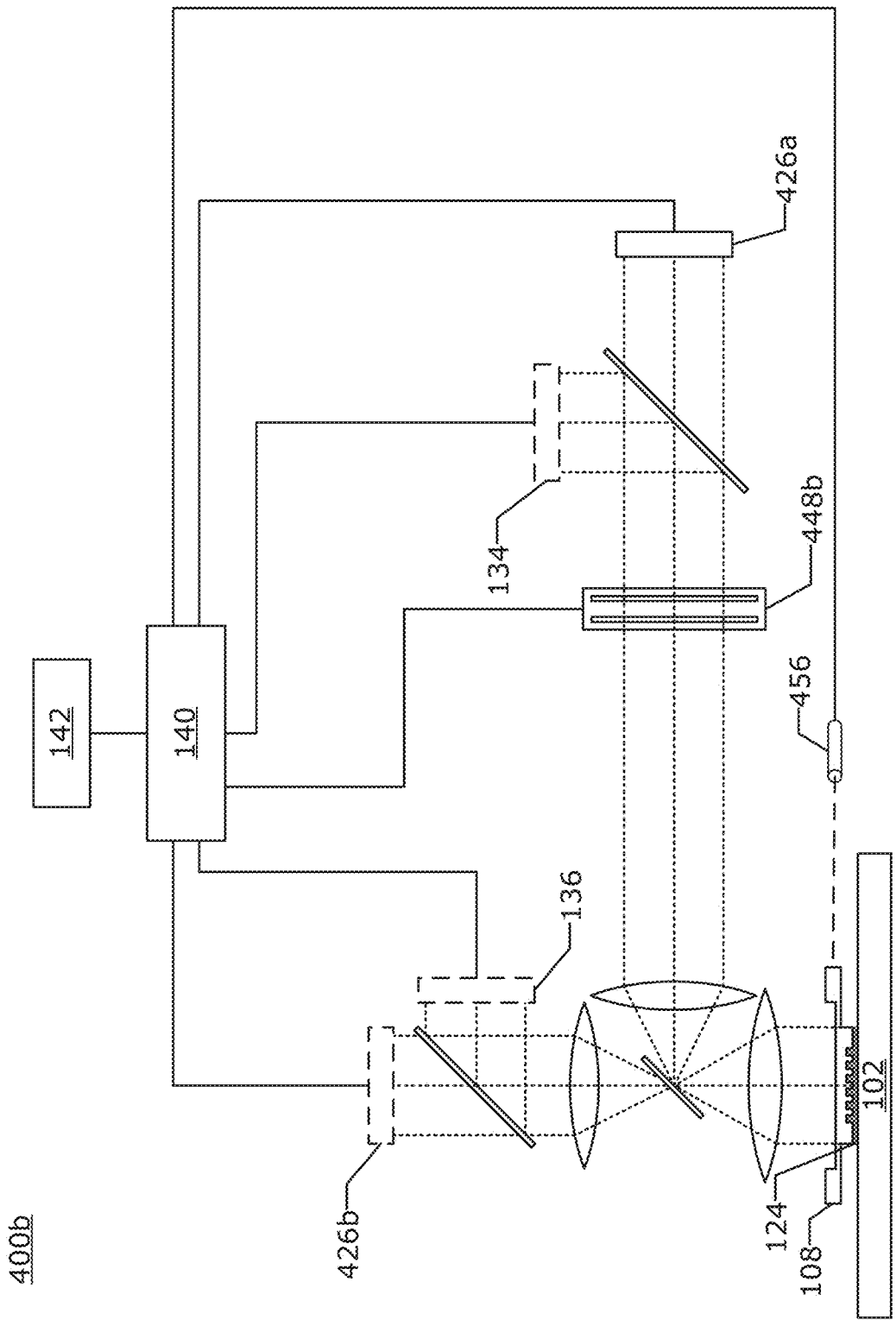

FIG. 4B is an illustration of an embodiment 400a in which the spatial light modulator is a transmissive spatial light modulator 448b such as an LCD. The transmissive spatial light modulator 448b may include a spatio-temporally addressable liquid crystal polarization retarder and a polarizer. The transmissive spatial light modulator 448b may include MEMS based spatio-temporally addressable light valves.

Figure 4C:
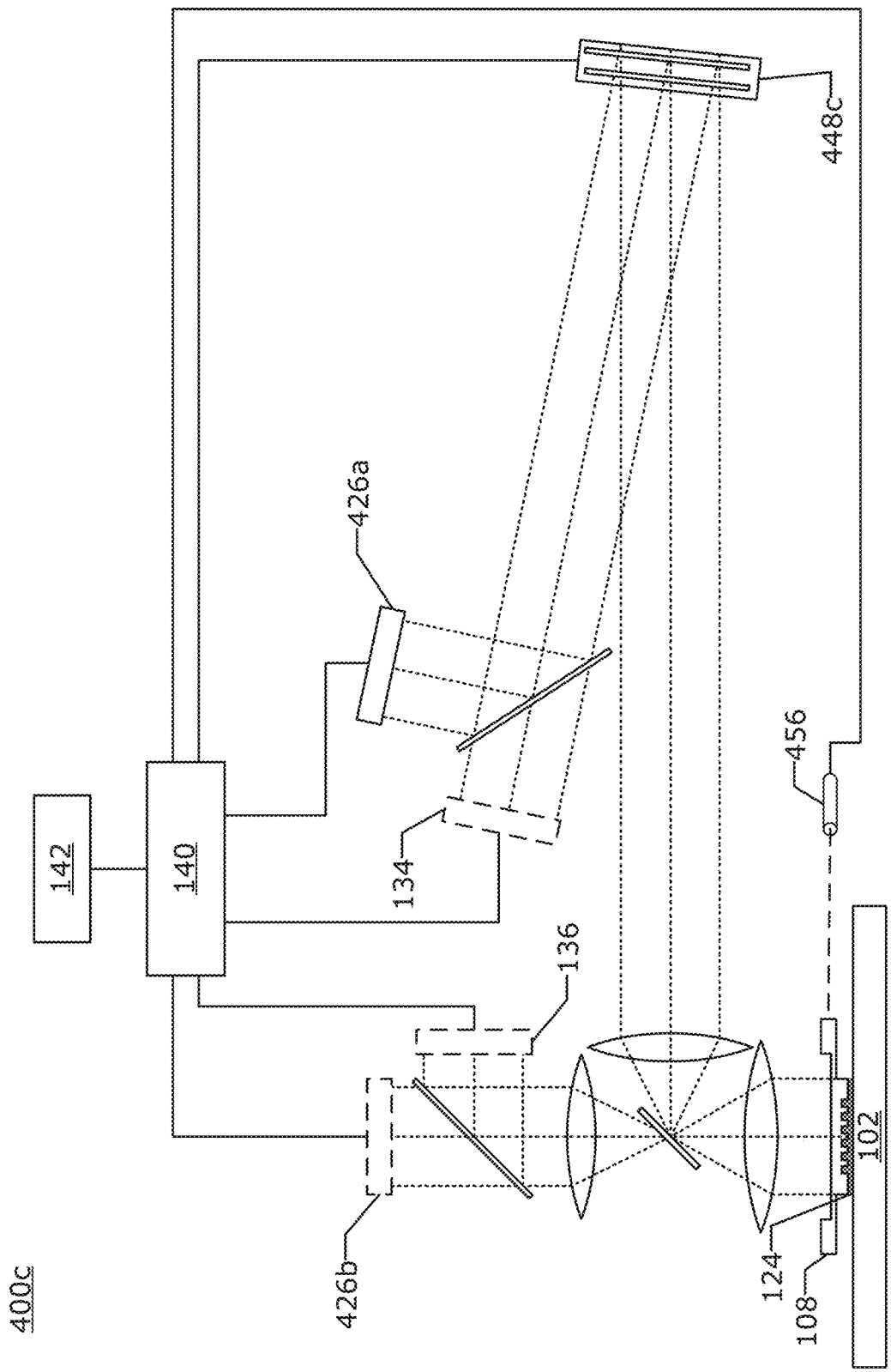

FIG. 4C is an illustration of an embodiment 400a in which the spatial light modulator is a reflective spatial intensity modulator 448c such as a LCoS device. The reflective spatial light modulator 448c may include a spatio-temporally addressable liquid crystal polarization retarder, a polarizer, and a reflective surface such as silicon. The reflective spatial intensity modulator 448c may include a MEMS based spatio-temporally addressable reflective surface.

The spatial light modulator 448 is positioned to illuminate the formable material 124 under the template 108 with a spatio-temporal distribution of actinic energy ($J/m^2$) in accordance with signals received from the processor 140 which are representative of a map of modulation values (for e.g. intensity & duty cycles). The actinic energy cures or helps cure the formable material 124 under the template 108. An embodiment may include one or more optical components such as lenses, mirror, apertures, etc. which guide the radiation from the spatial light modulator 448 to the formable material 124. An embodiment may include one or more optical components which help match the shape of the active area of the spatial light modulator 448 to the shape of the mesa 110. An embodiment may include one or more optical components which adjust the position of the focal plane of the actinic radiation from the spatial light modulator relative to formable material 124.

An embodiment, may include a second source of actinic radiation source 426b which has not been guided by the spatial light modulator to the plane of the formable material 124. Actinic radiation from the second source of actinic radiation 426b is guided by one or more other optical components to the formable material 124. The second source of actinic radiation 426b may have the same or different wavelength from the first actinic radiation source 426a. An embodiment may include one or more beam combiners 452b (such as prisms, half silvered mirrors, dichroic filters, etc.) which combine energy from the spatial light modulator 448 and the second source of actinic radiation 426b. In an embodiment, actinic radiation from each of the radiation sources may be directed at the formable material 124 from a different angle.

In an embodiment, the second source of actinic radiation 426b is configured to illuminate a central portion of the patterning surface 112 and the first source of actinic radiation 426a is configured illuminate a template border region at the outer edges of the patterning surface 112 near the mesa sidewalls 246. The template border region is a frame like region of patterning surface 112 of the template 108. An outer bound of the template border region maybe the mesa sidewalls 246 of the template 108. An inner bound of the template border region is inset from the mesa sidewalls 246 by a frame thickness. In an embodiment, the frame thickness maybe 1 mm; 0.5 mm; 0.4 mm; 0.3 mm; 0.1 mm; or 0.05 mm etc. In an embodiment, the frame thickness is an integer mm (for example 3; 5; 10; etc.) multiple of the projected pitch. In an embodiment, the frame thickness is a percent of the width of the pattering surface 112.

An embodiment, may include a field camera 136 which monitors the formable material under the template 108 and may control the timing of the illumination of the formable material 124 with actinic radiation.

FIG. 5A is an illustration of the active areas of 5 exemplary modulation elements (550a, 550b, 550c, 550d, and 550e) in a spatial light modulator with a 92% fill factor. FIG. 5B illustrates a cross section of an idealized actinic radiant intensity pattern 552i at the formable material 124 under the template 108, in the case where the five modulation elements 550a-e are turned on and focused at the plane of the formable material. In the present context, radiant intensity is equivalent to irradiance flux density ($W/m^2$). FIGS. 5C-G are illustrations of cross sections of actinic radiant intensity patterns 552a-g at the plane of the formable material in which the modulation elements are not focused at the plane of the formable material. FIG. 5C is actinic radiant intensity pattern 552a due to only modulation element 550a being on. FIG. 5D is actinic radiant intensity pattern 552b due to only modulation element 550b being on. FIG. 5E is actinic radiant intensity pattern 552c due to only modulation element 550c being on. FIG. 5F is actinic radiant intensity pattern 552d due to only modulation element 550d being on. FIG. 5G is actinic radiant intensity pattern 552g due to modulation elements 550a-e being on.

In an embodiment, each modulation element may produce a substantially cylindrically symmetric or substantially radially symmetric actinic radiant intensity spatial distribution that overlaps with those neighboring modulation elements as illustrated in FIGS. 5C-5F. Thus, the effective intensity at any location on the formable material, is not just the intensity of the radiation from the corresponding individual modulation element but a cumulative sum of contributions from neighboring modulation elements as well. The applicant has found that there is a need to intelligently select the modulation elements & their intensity (changing duty cycle) on the SLM such that the effective irradiation dose (intensity integrated over an exposure time) at any particular location can be controlled precisely and dimensional control of the curing can be significantly improved.

Figure 6A:
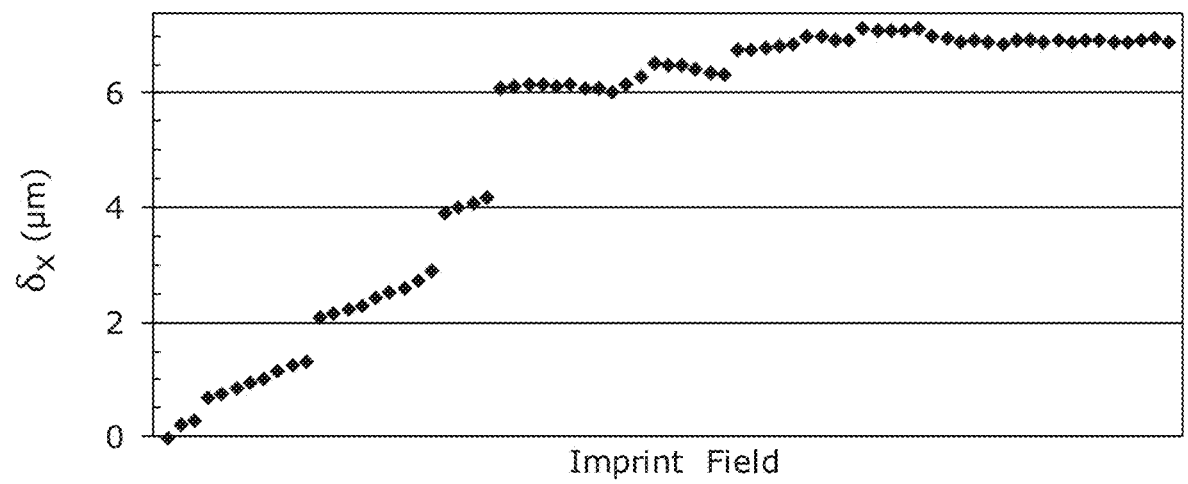
FIG. 6A is an illustration of a map representative of a desired curing region as used in an embodiment.
Figure 6B:
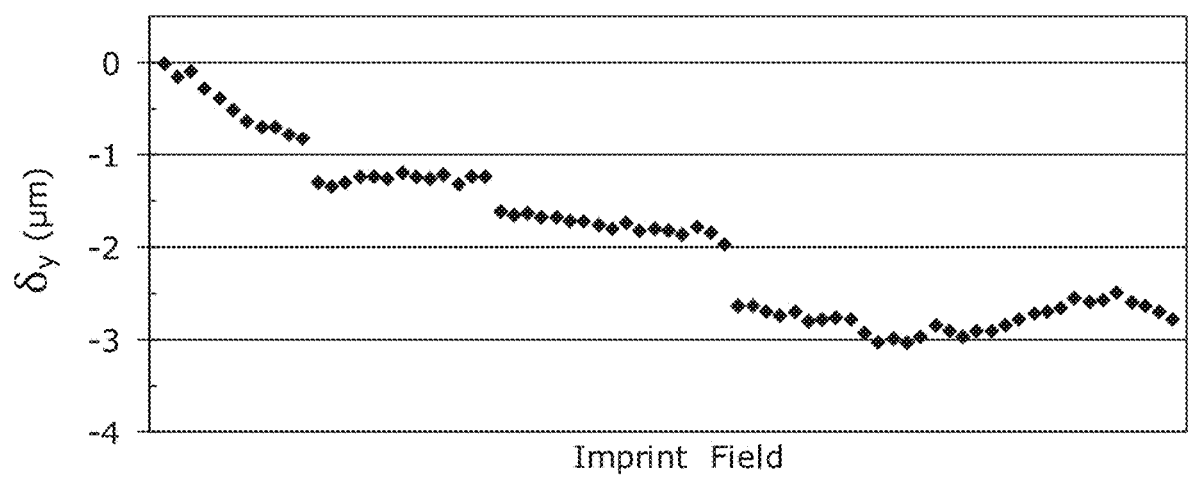
FIG. 6B is an illustration of a map of modulation values as used in an embodiment.

An embodiment 400a may include one or more displacement sensors 456 (position sensors) which can measure the position of the template and how it has changed. In an embodiment, a spectral interference displacement sensor 456 may be used to measure the relative movement of a reflective (or partially reflective) face of the template relative to another component of the embodiment, such as the template chuck. Each of the one or more displacement sensors may be used to measure the position of the template after a field has been imprinted and prior to the next field being cured. FIGS. 6A-B are charts of the measured displacements of the template 108 while it is in the template chuck 118 in between imprinting of individual imprint fields on a substrate 102.

Method of Adjusting the Modulation Values

Figure 7A:
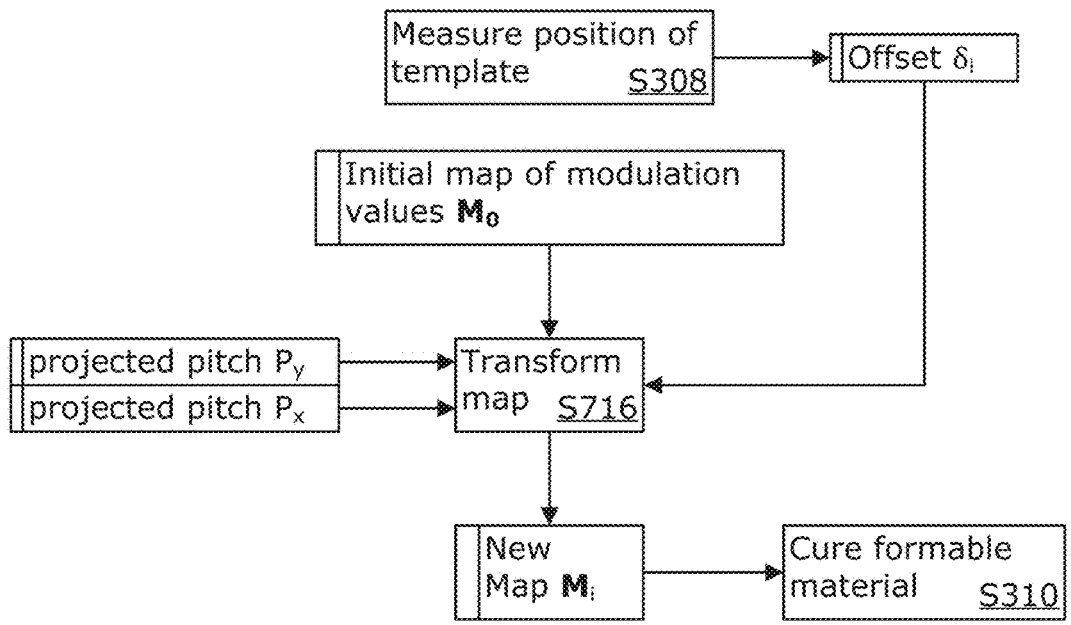
FIGS. 7A-D are flowcharts illustrating a map adjustment process as used in an embodiment.

In an embodiment, the imprinting process 300 includes curing the formable material in an imprinting field i during the curing step S308. During the curing step S308 actinic radiation is sent to the formable material from an SLM 448 with a pattern that is based on a set of modulation values $M_i$ for imprint field i that has been sent by the processor 140. The processor 140 determines the set of modulation values $M_i$ for an imprint field i based upon a transformation step S716 as illustrated in FIG. 7A. The transformation step S716 estimates a new map of modulation values $M_i$ for an imprint field i based upon initial map of modulation values $M_0$ and offset information $\delta_i$ as illustrated in FIG. 7A. The offset information $\delta_i$ is gathered in a measuring step S308 using the one or more position sensors 456 as illustrated in FIG. 7A. The offset information $\delta_i$ is representative of the offset position of the template from an ideal position of the template. The offset information $\delta_i$ may include two or more elements such as described in equation (1) here.

$$\delta_i = \{\delta_{i,x}, \delta_{i,y} \ldots\} \tag{1}$$

The transformation step S716 modifies the initial map of modulation values $M_0$ to produce a new map of modulation values $M_i$. The new map of modulation values $M_i$ matches the offset information $\delta_i$ by shifting and adjusting the modulation values (modulation duty cycle, transmittance, and/or reflectance) for each modulation element as illustrated in FIG. 7A. In an embodiment, the SLM 448 is in a fixed position relative to the template chuck 118. The transformation step S716 minimizes the impact of the template position slipping relative to both the template chuck 118 and the SLM 448 by adjusting the amount of radiation guided by each modulation element when driven in accordance with the new map of modulation values $M_i$. In an embodiment, actinic radiation reaching formable material 124 near the mesa sidewalls 246 is carefully controlled by taking the offset information $\delta_i$ into account when the new map of modulation values $M_i$ is used to cure the formable material in imprint field i in curing step S310.

Figure 6C:
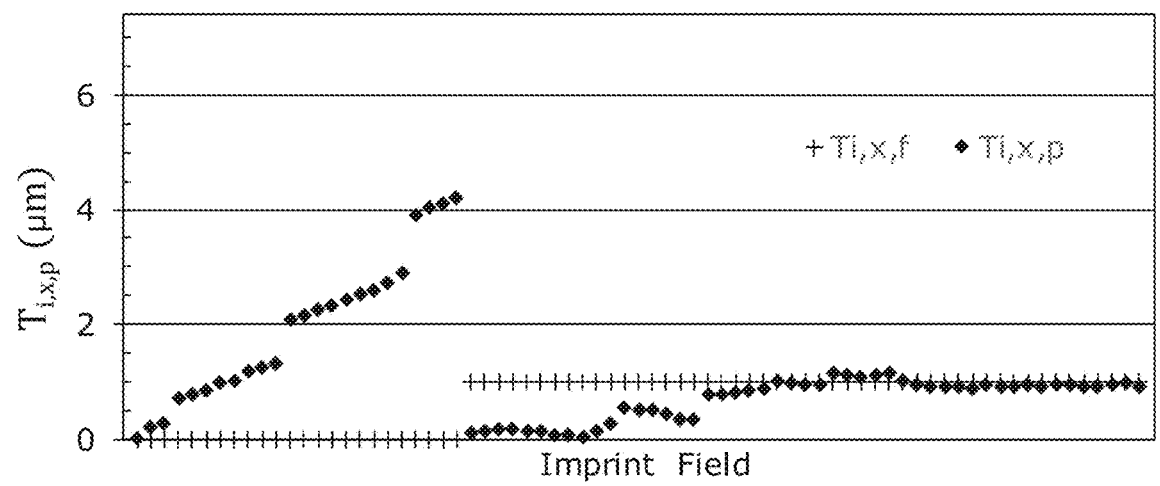
FIG. 6C is an illustration of a simulated cured region as used in an embodiment.

In an embodiment, the template chuck 118 holds the template 108 with a chucking force that is supplied for example by a vacuum chuck. During the imprinting process 300 sudden changes in the chucking force during the separation step S312 can cause the template 108 to shift in position relative to the template chuck 118 and other optical components such as the SLM 448. This shift $\delta_i$ can be tracked with the position sensors 456 as shown in FIGS. 6A-6C. During the contacting step S304, the template 108 is aligned with the substrate 102 using information from the position sensors 456 and information from alignment marks (not shown) on the substrate and template. The position sensors 456 can be used to provide a more accurate initial alignment of the template 108 which is then improved with information from the alignment marks.

In an embodiment, the capacity of the nanoimprint lithography system 100 to adjust the spatio-temporal distribution is limited by the SLM pitch of modulation elements of the SLM and the projected pitch (p) of the SLM pitch at the formable material and the variation of the intensity associated with each modulation element of the SLM. One or more optical components are used to magnify/demagnify the SLM pitch onto the formable material so that there is a projected pitch (p) of images of the modulation elements at the plane of the formable material. In an embodiment, there magnification along a first axis (x) is different form the magnification along the second axis (y) so that there is an x-axis projected pitch ($p_x$) and a y-axis projected pitch ($p_y$) of the modulation elements at the plane of the formable material.

Determination of Transformation Parameters

Figure 7B:
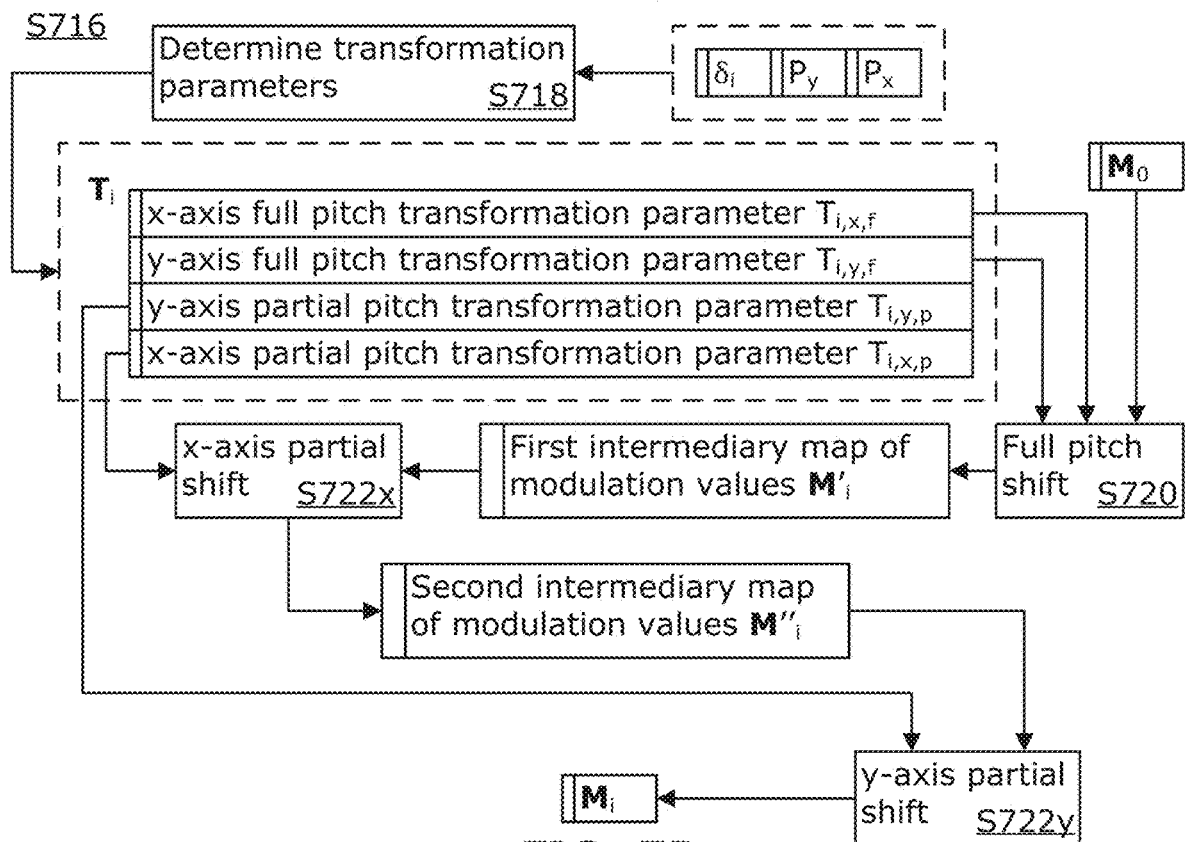

The transformation step S716 may include a transformation parameter determination step S718 for calculating a set of transformation parameters $T_i$ for each imprint field based on the projected pitches as illustrated in FIG. 7B. The set of transformation parameters may include full pitch transformation parameters and partial pitch transformation parameter along each axis for imprint field i.

$$T_i = \{T_{i,x,f}, T_{i,x,p}, T_{i,y,f}, T_{i,y,p} \ldots\} \tag{2}$$

Determining the full pitch transformation parameters may include calculating a scaled offset by dividing the offset information in a particular direction by the projected pitch in that direction and calculating the floor of that scaled offset as described by equations (3a) below which takes into account also the sign of the offset.

$$T_{i,x,f} = sgn(\delta_{i,x}) \left\lfloor \frac{|\delta_{i,x}|}{p_x} \right\rfloor \tag{3a}$$

$$T_{i,y,f} = sgn(\delta_{i,y}) \left\lfloor \frac{|\delta_{i,y}|}{p_y} \right\rfloor$$

In an alternative embodiment equations (3b) may also be used to calculate the full pitch transformation parameters. In the present disclosure the arrow symbol (→) used between a conditional test and an assignment represents a "then" portion of an "if-then" clause, if the conditional test returns a "TRUE" result.

$$\delta_{i,x} \geq p_x \rightarrow T_{i,x,f} = \left\lfloor \frac{\delta_{i,x}}{p_x} \right\rfloor \tag{3b}$$

$$\delta_{i,x} \leq -p_x \rightarrow T_{i,x,f} = \left\lceil \frac{\delta_{i,x}}{p_x} \right\rceil$$

$$-p_x < \delta_{i,x} < p_x \rightarrow T_{i,x,f} = 0$$

$$\delta_{i,y} \geq p_y \rightarrow T_{i,yx,f} = \left\lfloor \frac{\delta_{i,y}}{p_y} \right\rfloor$$

$$\delta_{i,y} \leq -p_y \rightarrow T_{i,y,f} = \left\lceil \frac{\delta_{i,y}}{p_y} \right\rceil$$

$$-p_y < \delta_{i,y} < p_y \rightarrow T_{i,y,f} = 0$$

The partial pitch transformation parameters for each axis and each imprint field may be calculated by taking the modulo of the offset information in a particular direction by the projected pitch in that direction as described by equations (4). FIG. 6C is an illustration of the results of calculating x-axis partial pitch transformation parameters $T_{i,x,p}$ and based on the x-axis offset $\delta_{i,x}$ data shown in FIG. 6A in which the projected pitch $p_x$ is 6 µm. The number of values which the partial pitch transformation parameters can take on is limited by the modulation depth of each modulation element of the SLM. The modulation depth may be limited by one or more of hardware and software used to control the SLM and other components. For example, the modulation depth may be limited to 3 bits in which case the partial pitch transformation parameters can only be: {0; 0.125; 0.250; 0.375; 0.500; 0.625; 0.750; 0.875}.

$$T_{i,x,p} = \operatorname{sgn}(\delta_{i,x})(|\delta_{i,x}| \bmod p_x)$$

$$T_{i,y,p} = \operatorname{sgn}(\delta_{i,y})(|\delta_{i,y}| \bmod p_y) \quad (4)$$

In an embodiment, the partial pitch transformation parameters are adjusted based on a plurality of conditions including but not limited to: intensity of the actinic radiation supplied at the plane of the formable material; dosage of the actinic radiation supplied at the plane of the formable material; wavelength of the actinic radiation supplied at the plane of the formable material; actinic radiation from neighboring modulation elements etc.

Full Pitch Shift of Modulation Map

Figures 8D, 8E:
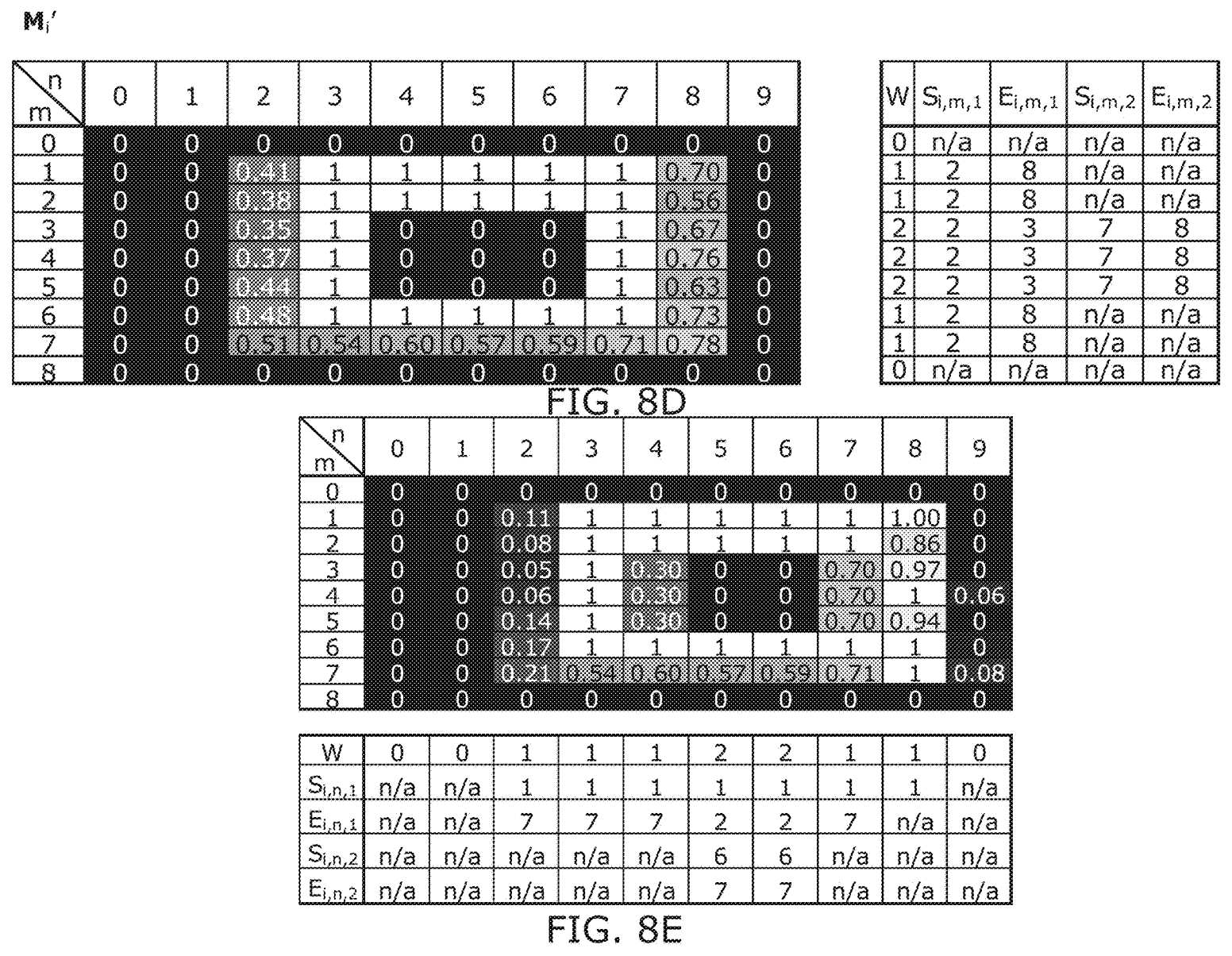
Figure 9A:
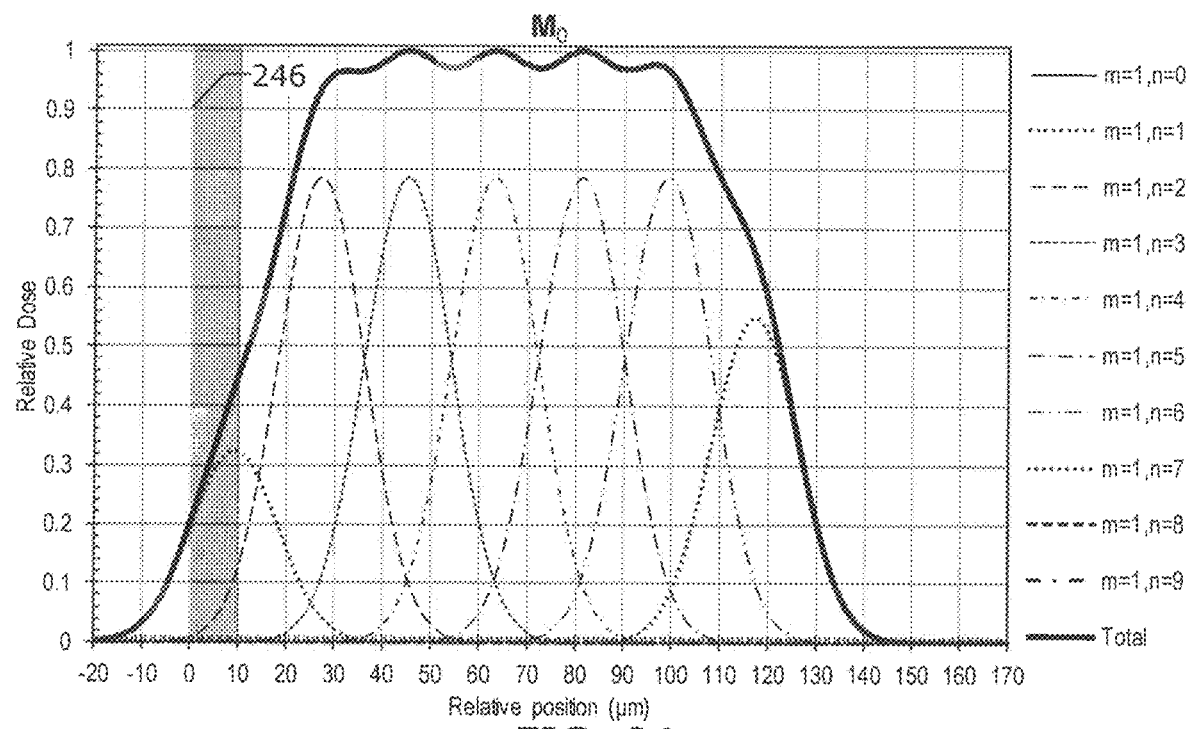
FIGS. 9A-D are illustrations of simulated distributions of actinic radiation produced by modulation maps which may be used in an embodiment.
Figure 9B:
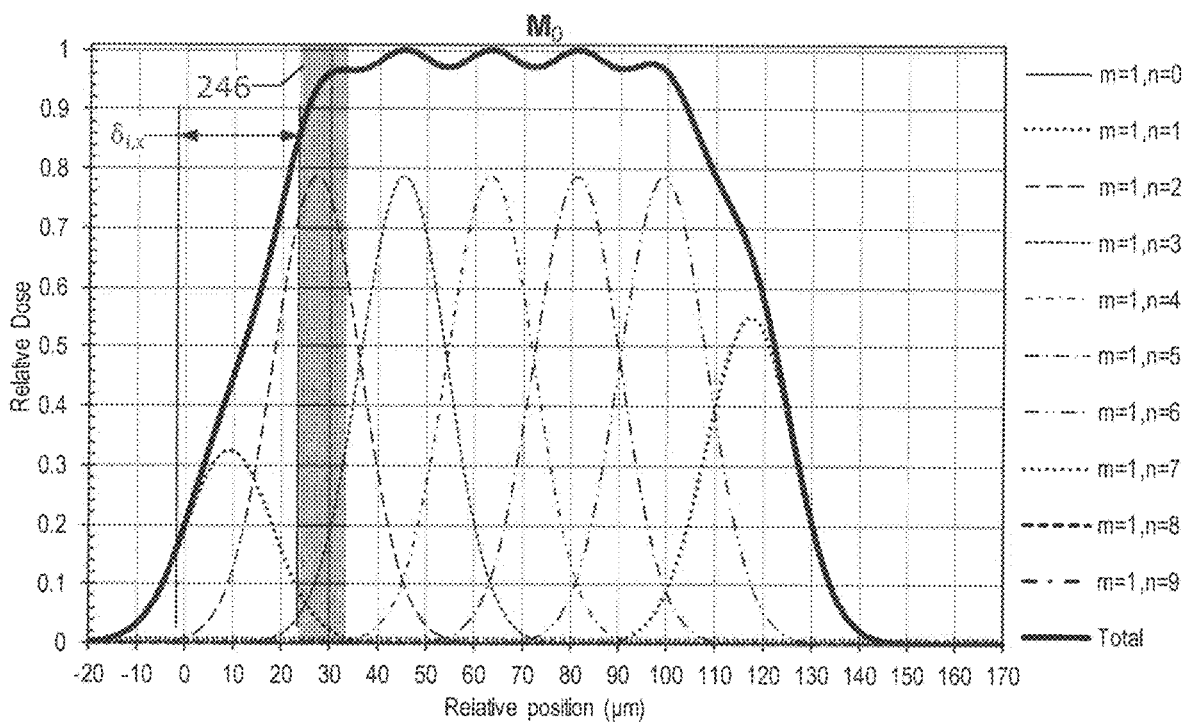

Once the full pitch transformation parameters are calculated by the processor 140, the processor 140 can also calculate an intermediary map of modulation values new map of modulation $M'_i$ in a full pitch shift step S720 as illustrated in FIG. 7B. The full pitch shift step S720 may be performed for each field in which each element $M_0(m, n)$ of the initial map of modulation values $M_0$ is shifted by the y-axis full pitch transformation parameter $T_{i,y,f}$ and the x-axis full pitch transformation parameter $T_{i,x,f}$ as described by equation (5) to form each element $M'_i(m, n)$ of the intermediary map of modulation values $M'_i$. FIG. 8A is an illustration of an exemplary initial $M_0$ map of modulation of values. FIG. 9A is an illustration, of a simulated cross section of relative distributions of dosages of actinic energy supplied by each element in row 1 of an exemplary initial map of modulation values $M_0$ and the total dosage supplied by row 1 of the SLM. In the simulation illustrated in FIG. 9A, each distribution of dosage of actinic energy is approximated by a gaussian distribution with a standard deviation of 9 µm on an 18 µm modulation element to modulation element pitch. Also illustrated in FIG. 9A is an ideal position of the mesa sidewall 246 relative to the exemplary initial map of modulation values $M_0$. Also illustrated in FIG. 9A is a 10 µm buffer region adjacent to the mesa sidewall in which some of the formable material might be slightly undercured. The applicant has found that it can be useful to provide less actinic energy near the mesa sidewalls 246 than is supplied to the interior region of patterning surface 112 of the template 108. The advantage to this is that any extruded formable material receives less actinic energy and is more likely to evaporate instead of forming extrusions. For example, in this ideal example the mesa sidewall receives 20% of the maximum energy supplied by the SLM 448. FIG. 9B shows that if the template moves for example by 23.4 µm, then the amount of energy supplied to one of the mesa sidewalls is over 80% which could cure extrusions while the amount of energy suppled on the other side of the template would not be enough to cure features near the mesa sidewall and outside the buffer region.

Figure 9C:
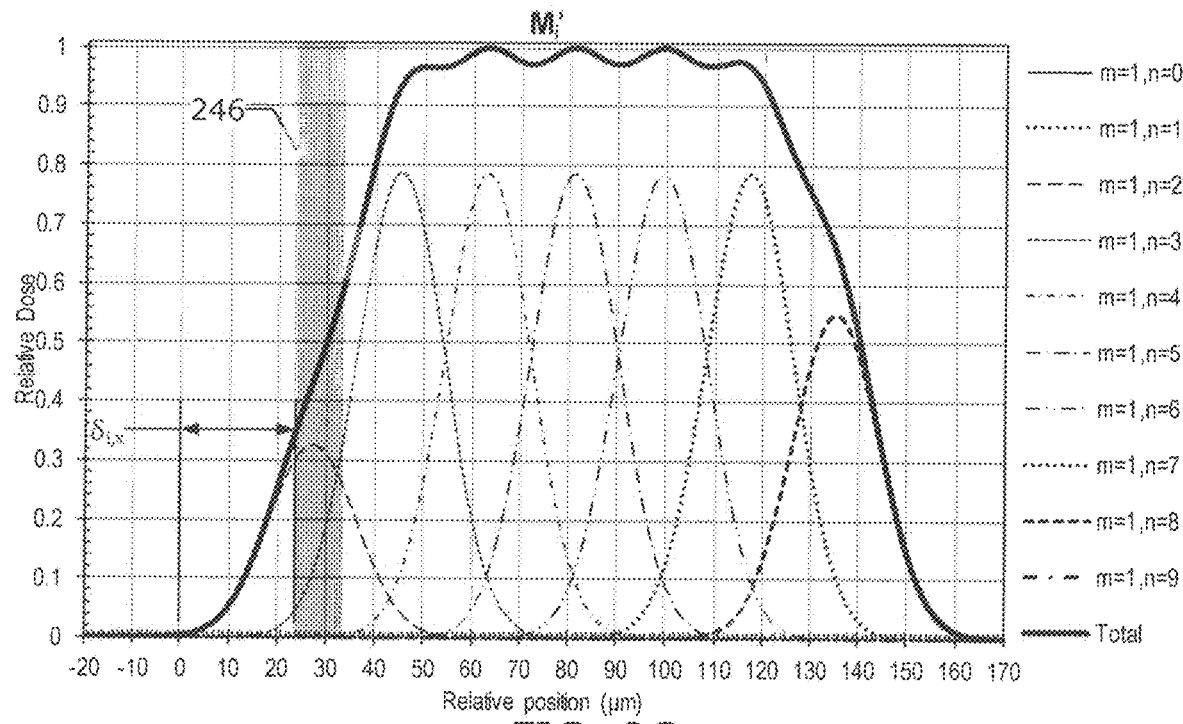

FIG. 8B is an illustration of an exemplary intermediary map of modulation values $M'_i$ in which $T_{i,y,f}=0$ and $T_{i,x,f}=1$. FIG. 9C is an illustration, of a relative distribution of actinic energy that would be supplied by each element in row 1 of the intermediary map of modulation values $M'_i$ and the total dosage of the supplied by row 1 of the SLM. Also illustrated in FIG. 9C is measured x-axis offset shift in position of the mesa sidewall 246 relative to the exemplary initial $M_0$ map of modulation of values.

$$M'_i(m,n) = M_0(m + T_{i,y,f}, n + T_{i,x,f}) \quad (5)$$

FIG. 9C is an illustration, of a simulated cross section of relative distributions of dosages of actinic energy supplied by each element in row 1 of an exemplary intermediary map of modulation values $M'_i$ and the total dosage of the supplied by row 1 of the SLM. Also illustrated in FIG. 9C is the position of the mesa sidewall 246 after it has been shifted by 23.4 µm. If this exemplary intermediary map of modulation values $M'_i$ is used in the curing step S310 then the mesa sidewalls could receive 30% of the maximum energy supplied by the SLM 448. Which under some circumstance can be enough to cure extrusions.

Partial Pitch Shift of Modulation Map

The intermediary map of modulation values $M'_i$ can then be used in an x-axis partial shift step S722x to form a second intermediary map of modulation values $M''_i$ as illustrated in FIG. 7B. FIG. 8C is an illustration of intermediary map of modulation values $M'_i$ being shift by $T_{i,x,p}=0.3$. The second intermediary map of modulation values $M''_i$ can then be used in a y-axis partial shift step S722y to form a new map of modulation values $M_i$. The new map of modulation values $M_i$ may then be used to cure the formable material.

Figure 7C:
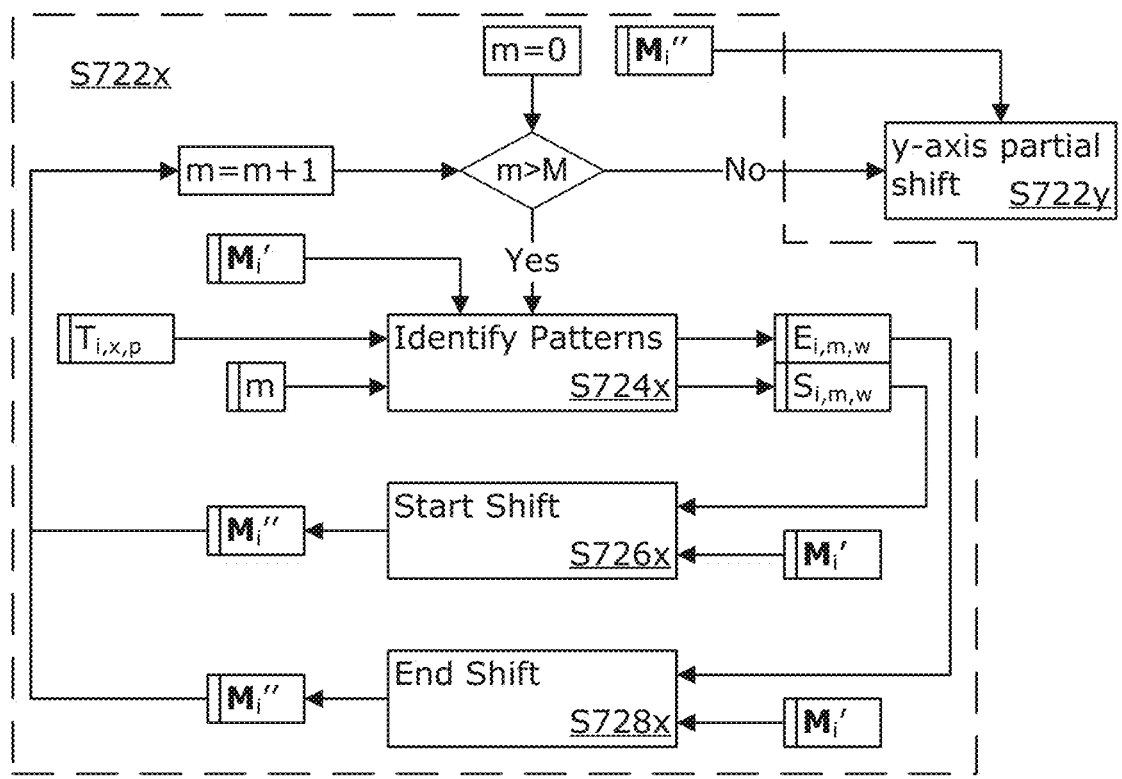

In an embodiment, the maps of modulation values ($M_0$, $M'_i$, $M''_i$, $M_i$) may be matrices with M rows and N columns. The x-axis partial shift step S722x may include performing a plurality of operations on each row m of the intermediary map of modulation values $M'_i$ as illustrated in FIG. 7C. The maps of modulation values illustrated in FIGS. 8A-C are for illustrative purposes only. In this illustrative example the minimum value is zero and the maximum values is 1. In an embodiment, the map of modulation values would have many more elements and may have a different range of values. For example, the map of modulation values maybe an array that is as small as a 3×3 array, as large as 2560×1600 array, or an even larger array. The following methods may be adjusted to consider different ranges and different size maps. The size of the map of modulation values maybe determined by the desired resolution of the final projected actinic radiation pattern, the resolution of the SLM, and the reliability of individual modulation elements of the SLM.

x-Axis Partial Pitch Shift of Modulation Map

The x-axis partial shift step S722x may include a first candidate pattern identification step S724x in which one or more candidate patterns $P_{i,m,w}$ are identified in each row m as illustrated in FIG. 7C. A candidate pattern $P_{i,m,w}$ is a set of neighboring modulation value in row m of the intermediary map of modulation values $M'_i$ which meet a plurality of criteria. One of the criteria is that none of modulation values in the candidate pattern $P_{i,m,w}$ has the minimum allowable modulation value (for example 0). A second criteria may be based on the x-axis partial pitch transformation parameters $T_{i,x,p}$.

For each candidate pattern $P_{i,m,w}$ that is identified, a starting column index $S_{i,m,w}$ and an ending column index $E_{i,m,w}$ of each candidate pattern are determined in the first candidate pattern identification step S724x as illustrated in FIG. 7C. In an embodiment, a number of elements of the candidate pattern is 2, 5, 10, or N−2. Under certain special circumstances, the candidate pattern may have up N elements (the width of the modulation map). FIG. 8D is an illustration of starting column indexes $S_{i,m,w}$ and ending column indexes $E_{i,m,w}$ for an exemplary intermediary map of modulation values $M'_i$.

The x-axis partial shift step S722x may include a start shift step S726x in which one or more elements at and/or adjacent to a starting column index $S_{i,m,w}$ of the intermediary map of modulation values $M'_i$ are adjusted in view of the $T_{i,x,p}$ and a lower limit LL on a range of map of modulation values. For example, in one embodiment, x-axis partial pitch transformation parameters $T_{i,x,p}$ is subtracted from the starting column index $S_{i,m,w}$ of the intermediary map of modulation values $M'_i$ as described in equations (6) below in which the lower limit LL puts a floor on the values to which the starting column index $S_{i,m,w}$ of the second intermediary map of modulation values $M''_i$ may be assigned. In which case, additional energy is also removed using a neighboring modulation element as described in equation (6) below.

$$M'_i(m, S_{i,m,w}) - T_{i,x,p} \geq LL \rightarrow M''_i(m, S_{i,m,w}) = M'_i(m, S_{i,m,w}) - T_{i,x,p} \quad (6)$$

$$M'_i(m, S_{i,m,w}) - T_{i,x,p} < LL \rightarrow$$

$$\left[ \begin{array}{c} (M''_i(m, S_{i,m,w}) = LL) \cup \\ \left( \begin{array}{c} M''_i(m, S_{i,m,w}+1) = M'_i(m, S_{i,m,w}+1) - T_{i,x,p} + \\ M'_i(m, S_{i,m,w}) \end{array} \right) \end{array} \right]$$

The x-axis partial shift step S722x may include an end shift step S728x in which one or more elements at and/or adjacent to an ending column index $E_{i,m,w}$ of the intermediary map of modulation values $M'_i$ are adjusted in view of the $T_{i,x,p}$ and an upper limit UL on a range of map of modulation values. For example, in one embodiment, x-axis partial pitch transformation parameters $T_{i,x,p}$ is added to the ending column index $E_{i,m,w}$ of the intermediary map of modulation values $M'_i$ as described in equations (7) below in which the upper limit UL puts a ceiling on the values to which the ending column index $E_{i,m,w}$ of the second intermediary map of modulation values $M''_i$ may be assigned. In which case, additional energy is also added using a neighboring modulation element as described in equation (7) below.

$$M'_i(m, E_{i,m,w}) + T_{i,x,p} \leq UL \rightarrow M''_i(m, E_{i,m,w}) = M'_i(m, E_{i,m,w}) + T_{i,x,p} \quad (7)$$

$$M'_i(m, E_{i,m,w}) + T_{i,x,p} > UL \rightarrow$$

$$\left[ \begin{array}{c} (M''_i(m, E_{i,m,w}) = UL) \cup \\ \left( \begin{array}{c} M''_i(m, E_{i,m,w}+1) = M'_i(m, E_{i,m,w}+1) + T_{i,x,p} - \\ M'_i(m, E_{i,m,w}) \end{array} \right) \end{array} \right]$$

FIG. 8C is an illustration of an exemplary second intermediary map of modulation values $M''_i$ note that modulation values in columns 3-7 were not adjusted only the starting and ending points of the patterns are adjusted. The applicant has found that leaving these modulation elements unchanged improves repeatability.

Figure 9D:
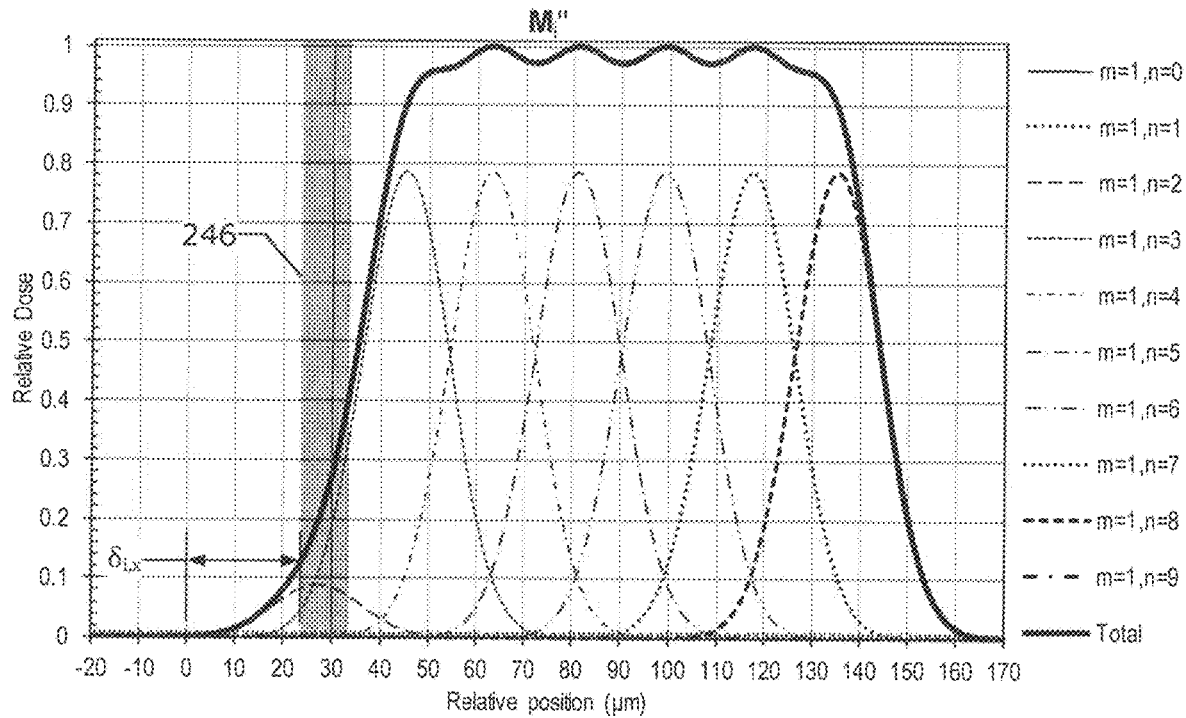

FIG. 9D is an illustration, of a simulated cross section of relative distributions of dosages of actinic energy supplied by each element in row 1 of an exemplary an exemplary second intermediary map of the supplied by row 1 of the SLM. Also illustrated in FIG. 9D is the position of the mesa sidewall 246 after it has been shifted by 23.4 μm. If this exemplary second intermediary map of modulation values $M''_i$ is used in the curing step S310 then the mesa sidewalls could receive less than 20% of the maximum energy supplied by the SLM 448. Which under most circumstances is should prevent the formation of extrusions while only the buffer region is slightly undercured.

Y-Axis Partial Pitch Shift of Modulation Map

Figure 7D:
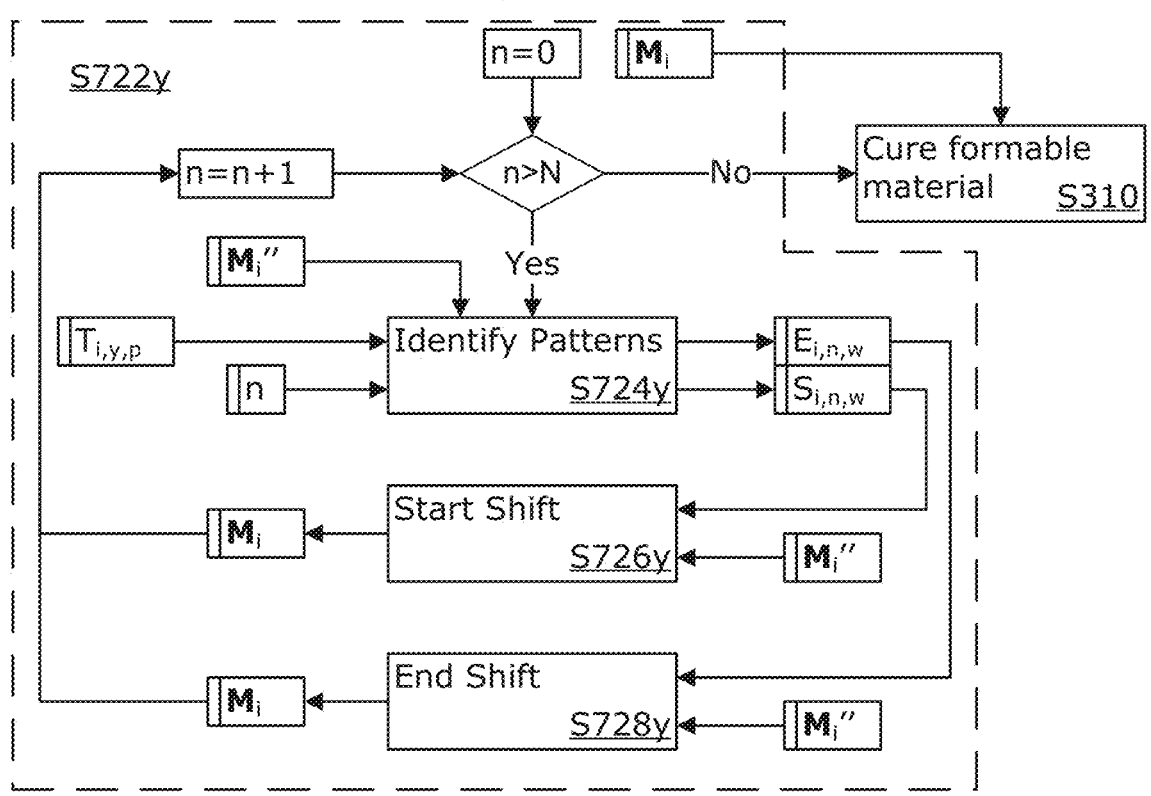

The y-axis partial shift step S722y may include a second candidate pattern identification step S724y in which one or more candidate patterns $P_{i,n,w}$ are identified in each column n as illustrated in FIG. 7D. A candidate pattern $P_{i,n,w}$ is a set of neighboring modulation value in column n of the second intermediary map of modulation values $M''_i$ which meet a plurality of criteria. One of the criteria is that none of modulation values in the candidate pattern $P_{i,n,w}$ has the minimum allowable modulation value (for example 0). A second criteria may be based on the y-axis partial pitch transformation parameters $T_{i,y,p}$.

For each candidate pattern $P_{i,n,w}$ that is identified, a starting row index $S_{i,n,w}$ and an ending row index $E_{i,n,w}$ of each candidate pattern are determined in the second candidate pattern identification step S724y as illustrated in FIG. 7D. In an embodiment, a number of elements of the candidate pattern is 2, 5, 10, or M−2. Under certain special circumstances, the candidate pattern may have up M elements (the height of the modulation map). FIG. 8E is an illustration of starting column indexes $S_{i,n,w}$ and ending column indexes $E_{i,n,w}$ for an exemplary second intermediary map of modulation values $M'_i$. Note that there are no candidate patterns in column 9 to be shifted even though there are non-zero elements in column 9. In an alternative embodiment, the number of patterns in column may vary depending on the value of y-axis full pitch transformation parameters $T_{i,y,f}$.

The y-axis partial shift step S722y may include a y-axis start shift step S726y in which one or more elements at and/or adjacent to a starting row index $S_{i,n,w}$ of the intermediary map of modulation values M; are adjusted in view of the $T_{i,y,p}$ and a lower limit LL on a range of map of modulation values. For example, in one embodiment, y-axis partial pitch transformation parameters $T_{i,y,p}$ is subtracted from the starting row index $S_{i,n,w}$ of the second intermediary map of modulation values $M''_i$ as described in equations (8) below in which the lower limit LL puts a floor on the values to which the starting column index $S_{i,n,w}$ of the new map of modulation values $M_i$ may be assigned. In which case, additional energy is also removed using a neighboring modulation element as described in equation (8) below.

$$M_i(S_{i,n,w}, n) - T_{i,y,p} \geq LL \rightarrow M_i(S_{i,n,w}, n) = M''_i(S_{i,n,w}, n) - T_{i,y,p} \quad (8)$$

$$M_i(S_{i,n,w}, n) - T_{i,y,p} < LL \rightarrow$$

$$\left[ \begin{array}{c} (M_i(S_{i,n,w}, n) = LL) \cup \\ \left( \begin{array}{c} M_i(S_{i,n,w}, +1, n) = M''_i(S_{i,n,w}+1, n) - T_{i,y,p} + \\ M''_i(S_{i,n,w}, n) \end{array} \right) \end{array} \right]$$

The y-axis partial shift step S722y may include a y-axis end shift step S728y in which one or more elements at and/or adjacent to an ending row index $E_{i,n,w}$ of the second intermediary map of modulation values $M''_i$ are adjusted in view of the $T_{i,y,p}$ and an upper limit UL on a range of map of modulation values. For example, in one embodiment, y-axis partial pitch transformation parameters $T_{i,y,p}$ is added to the ending row index $E_{i,n,w}$ of the second intermediary map of modulation values $M''_i$ as described in equations (9) below in which the upper limit UL puts a ceiling on the values to which the ending column index $E_{i,m,w}$ of the new map of modulation values $M_i$ may be assigned. In which case, additional energy is also added using a neighboring modulation element as described in equation (9) below.

$$M_i(E_{i,n,w}, n) + T_{i,y,p} \leq UL \rightarrow M_i(E_{i,n,w}, n) = M_i''(E_{i,n,w}, n) + T_{i,y,p} \quad (9)$$

$$M_i(E_{i,n,w}, n) + T_{i,y,p} > UL \rightarrow$$

$$\left[ \begin{array}{c} (M_i(E_{i,n,w}, n) = UL) \cup \\ \left( \begin{array}{c} M_i(E_{i,n,w}, +1, n) = M_i''(E_{i,n,w}+1, n) + T_{i,y,p} - \\ M_i''(E_{i,n,w}, n) \end{array} \right) \end{array} \right]$$

New Map of Modulation Values

The applicant has found that using the process described above to transform the initial map of modulation values into a new map of modulation values which takes into account the offset information can help ensure that the energy provided to the entire pattern area remains the same after the shift adjustment of the DMD input pattern as compared to the energy in the pattern before the shift adjustment. Additionally, the relative spatial energy variation within the pattern also stays the same, thus preserving the integrity of the pattern.

Alternative Embodiments

In an alternative embodiment, the x-axis projected pitch ($p_x$) and y-axis projected pitch ($p_y$) vary across the imprint field. This variation may be taken into account by making the projected pitches vary with row and column indexes m, n ($p_x(m,n); p_y(m,n)$). This variation may then propagate against all the variables that depend on the projected pitches are also functions of the indexes m and n. This variation may be measured in a registration step.

In an alternative embodiment, a mapping function f may be determined which maps centroids of the modulations elements on the SLM ($X_{n,m,S}$, $y_{n,m,S}$) to measured centers of curing regions on the plane of the formable material ($x_{n,m,0}$, $y_{n,m,0}$) when the offset information $\delta_i$ is zero that corresponds to each modulation element (m,n). Equation (10) below is an example of such a mapping function. In which D is a nominal magnification of the optical system; r is a radial distance from a center of the optical system; and the fitting parameters of the mapping function are: {$k_1$; $k_2$; $p_1$; $p_2$}. Equations (10) for example may compensate for translational shifts as well as shape distortions such as barrel and pin-cushion of the optical system.

$$f = \begin{cases} x_{n,m,0} = Dx_{n,m,S}(1 + k_1 r^2 + k_2 r^4) + 2p_1 D^2 x_{n,m,S} y_{n,m,S} + p_2(r^2 + 2D^2 x_{n,m,S}^2) \\ y_{n,m,0} = Dy_{n,m,S}(1 + k_1 r^2 + k_2 r^4) + 2p_2 D^2 x_{n,m,S} y_{n,m,S} + p_1(r^2 + 2D^2 y_{n,m,S}^2) \end{cases} \quad (10)$$

$$\begin{Bmatrix} x_{n,m,0} \\ y_{n,m,0} \end{Bmatrix} = f \begin{Bmatrix} x_{n,m,S} \\ y_{n,m,S} \end{Bmatrix}$$

$$\begin{Bmatrix} x_{n,m,S} \\ y_{n,m,S} \end{Bmatrix} = f^{-1} \begin{Bmatrix} x_{n,m,0} \\ y_{n,m,0} \end{Bmatrix}$$

In an embodiment, one or more registration experiments may be performed to determine this registration data which may include one or both of ($x_{n,m,S}$, $y_{n,m,S}$) and for each modulation element (m,n). These registration experiments may include exposing a plurality of imprint fields to one or more patterns of actinic radiation to cure portions of the formable material to actinic radiation. Then measuring these cured regions to identify centroids ($x_{n,m,0}$, $y_{n,m,0}$) associated with individual modulation elements. In an exemplary embodiment, two interleaved checkerboard modulation maps may be used to expose a plurality of imprint fields to generate the registration data. Other registration modulation maps may also be used. An optical microscope or other inspection tools may be used to identify the centroids of the cured regions associated with each modulation element. In an embodiment, ($x_{n,m,S}$, $y_{n,m,S}$) and ($x_{n,m,0}$, $y_{n,m,0}$) may be estimated based on design and/or simulation data.

Once a plurality of registration data is obtained, the fitting parameters may be determined by numerically fitting the model function to the registration data, for example using chi-square minimization. Numerically fitting may also be used to identify a model function which best fits the registration data. The inverse of the mapping function ($f^{-1}$) can then be generated numerically. Which may then be used to generate a new adjusted map to correct the modulation map for mask slips in x & y.

The inverse model function $f^{-1}$ maps positions of the cured formable material on to modulation elements of the SLM 448 which can then be used to generate an x-axis offset information $\delta_{i,x}$ matrix and a y-axis offset information $\delta_{i,y}$ matrix as described by equation (11) below which describes how to calculate the elements of these matrices. Once these offset information matrices ($\delta_{i,x}(m,n), \delta_{i,y}(m,n)$) are determined they may be used in replacement of the constant offset information($\delta_{i,x}, \delta_{i,y}$) used in the equations above.

$$\begin{Bmatrix} x_{n,m,S} + \delta_{i,x,n,m} \\ y_{n,m,S} + \delta_{i,y,n,m} \end{Bmatrix} = f^{-1} \begin{Bmatrix} x_{n,m,0} + \delta_{i,x} \\ y_{n,m,0} + \delta_{i,y} \end{Bmatrix} \quad (11)$$

$$\begin{Bmatrix} \delta_{i,x,n,m} \\ \delta_{i,y,n,m} \end{Bmatrix} = f^{-1} \begin{Bmatrix} x_{n,m,0} + \delta_{i,x} \\ y_{n,m,0} + \delta_{i,y} \end{Bmatrix} - \begin{Bmatrix} x_{n,m,S} \\ y_{n,m,S} \end{Bmatrix}$$

Other search methods may be used to obtain the adjusted modulation maps that minimize the errors due to the template slipping between the desired curing and actual curing for example searching for an adjusted modulation maps by trial and error (or heuristically based on beam properties-beam size & shape) that adjusts for the template slippage while maintaining the integrity of the initial modulation map.

In an alternative embodiment, an additional criteria may be used in addition to or instead of the process described above to determine the map of modulation values. For example, the additional criteria may include minimizing an objective function such as the one described in equation (12) below. In which β and γ are 1 or more and refer to neighboring modulation elements over which the actinic energy is partially adjusted.

$$\min_B \left| T_{i,x,f} * p_x + \sum_{s=0}^{\beta} (T_{i,x,p,s} * p_x) - \delta_{i,x} \right| \qquad (12)$$

$$\sum_{s=0}^{\beta} (T_{i,x,p,s} * p_x) < p_x$$

$$\min_B \left| T_{i,y,f} * p_y + \sum_{s=0}^{\gamma} (T_{i,y,p,s} * p_y) - \delta_{i,y} \right|$$

$$\sum_{s=0}^{\gamma} (T_{i,y,p,s} * p_y) < p_y$$

In an embodiment, feedforward control methods may be used to control the adjustment of the map of modulation values. For example, in a situation in which $\delta_i$ is not stable on the scale that is relevant in view of the modulation depth of the SLM. A predicted value for $\delta_i$ may be used in determining the new map of modulation values. The predicted value for $\delta_i$ may be determined based on the measured trajectory $\delta_i(t)$ of and a historical record of previous measured trajectories. In an embodiment, feedforward control methods may be used to choose a predetermined good map of modulation values based on $\delta_i$. A plurality of experiments may be performed which allow maps of modulation values to be correlated with a measured position of the template. In an embodiment, a limited set (at least two maps) of map of modulation values are identified for a limited set of measured offset information that provide good performance. A particular offset is measured and an interpolated map of modulation values is calculated based on the limited set of map of modulation values.

An embodiment, includes a first source of actinic radiation 426a and a second source of actinic radiation 426b. The first source of actinic radiation 426a includes modulation elements which can adjust a spatial temporal distribution of the actinic radiation in particular near the template border region. The second source of actinic radiation 426b may be configured to provide a brighter and/or more effective actinic radiation to a central region of the template some of which may leak into the template border region in a uniform manner. In an embodiment, the transformation step S716 can consider this actinic radiation from the second source of actinic radiation.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of imprinting comprising:
    receiving template slippage data about a change in a position of a template relative to a reference position;
    receiving a desired actinic radiation pattern to expose formable material in an imprinting field under a template border region of the template;
    determining a new actinic radiation pattern to expose the template border region that compensates for the template slippage;
    contacting the formable material in the imprinting field on the substrate with the template;
    exposing the template border region to the new actinic radiation pattern while the template is in contact with the formable material, exposing at least a central region of the template to a first distribution of a dosage of actinic radiation while also exposing the template border region to the new actinic radiation pattern; and
    wherein determining the new actinic radiation pattern includes considering the first distribution of the dosage of actinic radiation.

2. The method according to claim 1, further comprising:
    sending the new actinic radiation pattern to a spatial light modulator as a map of modulation values.

3. The method according to claim 2, wherein the spatial light modulator is positioned in a fixed position relative to a template chuck configured to hold the template during the method of imprinting.

4. The method according to claim 2, wherein each element in the map of modulation values is associated with a corresponding modulation element of the spatial light modulator.

5. The method according to claim 4, wherein the spatial light modulator includes a digital micromirror device; and
    wherein each element in the map of modulation values includes a modulation duty cycle that is representative of a period of time during which an individual mirror on the digital micromirror device guides actinic radiation towards formable material under the template.

6. The method according to claim 4, wherein the spatial light modulator includes a transmissive spatial intensity modulator;
    wherein each element in the map of modulation values includes one or both of a modulation duty cycle and a specified transmissivity; and
    wherein a period during which an individual modulation element of the transmissive spatial intensity modulator transmits with the specified transmissivity of actinic radiation that is guided towards formable material under the template is determined by the corresponding element of the map of modulation values.

7. The method according to claim 6, wherein the transmissive spatial intensity modulator includes:
    a liquid crystal polarization retarder; and
    a polarizer.

8. The method according to claim 4, wherein the spatial light modulator includes a reflective spatial intensity modulator;
    wherein each element in the map of modulation values includes one or both of a modulation duty cycle and a specified reflectance;
    wherein a period during which an individual modulation element of the reflective spatial intensity modulator reflects with the specified reflectance of actinic radiation that is guided towards formable material under the template is determined by the corresponding element of the map of modulation values.

9. The method according to claim 8, wherein the reflective spatial intensity modulator includes:
    a liquid crystal polarization retarder on silicon with a reflective coating; and
    a polarizer.

10. The method according to claim 1, wherein the formable material forms a cured film when exposed to actinic radiation.

11. A method for manufacturing articles using the method of imprinting according to claim 10, further comprising:
    processing the substrate on which the cured film is formed so as to manufacture the articles.

12. The method according to claim 1, wherein determining the new actinic radiation pattern comprises:
  determining a set of transformation parameters based on:
    the template slippage data;
    an x-axis projected pitch; and
    a y-axis projected pitch; and
  generating a new map of modulation values that is representative of the new actinic radiation pattern based on the set of transformation parameters.

13. The method according to claim 12, wherein the desired actinic radiation pattern is represented by an initial map of modulation values;
  wherein the set of transformation parameters includes:
    a y-axis full pitch transformation parameter; and
    an x-axis full pitch transformation parameter; and
  wherein generating the new map of modulation values includes shifting the initial map of modulation values in accordance with the set of transformation parameters.

14. The method according to claim 12, wherein the desired actinic radiation pattern is represented by an initial map of modulation values;
  wherein the set of transformation parameters includes:
    a y-axis partial pitch transformation parameter; and
    an x-axis partial pitch transformation parameter; and
  wherein generating the new map of modulation values includes adding and subtracting in accordance with the set of transformation parameters from one or more subsets of a selected modulation map selected from: the initial map of modulation values; and a shifted initial map of modulation values.

15. The method according to claim 14, wherein each subset in the one or more subsets includes two or more elements of the selected modulation map.

16. The method according to claim 1, wherein determining the new actinic radiation pattern includes calculating an interpolated map of modulation values based on the template slippage data and at least two maps of modulation values;
  wherein the interpolated map of modulation values is sent to a spatial light modulator to generate the new actinic radiation pattern.

17. The method according to claim 1, wherein the template slippage data includes information about the change in the position of the template from at least two different times;
  wherein determining the new actinic radiation pattern includes:
    estimating a predicted position of the template when the template border region is exposed to actinic radiation based on the template slippage data;
    calculating a new map of modulation values based on predicted position of the template;
  wherein the new map of modulation values is sent to a spatial light modulator to generate the new actinic radiation pattern.

18. A system comprising:
a memory; and
a processor configured to:
  receive template slippage data about a change in a position of a template relative to a reference position;
  receive a desired actinic radiation pattern to expose formable material in an imprinting field under a template border region of the template;
  determine a new actinic radiation pattern to expose the template border region that compensates for the template slippage;
  send instructions for the system to bring the formable material in the imprinting field on the substrate into contact with the template;
  send instructions for the system to expose the template border region to the new actinic radiation pattern while the template is in contact with the formable material,
  send instructions for the system to expose at least a central region of the template to a first distribution of a dosage of actinic radiation while also exposing the template border region to the new actinic radiation pattern; and
wherein determining the new actinic radiation pattern includes considering the first distribution of the dosage of actinic radiation.

19. The system as recited in claim 18, further comprising:
a nanoimprint lithography system including:
  a spatial light modulator configured to receive a map of modulation values that are representative of the new actinic radiation pattern;
  a source of actinic radiation configured to illuminate the spatial light modulator with actinic radiation;
  a template chuck configured to hold the template;
  a sensor configured to measure template slippage data and send the template slippage data to the processor; and
  a positioning system configured to bring the formable material in the imprinting field on the substrate into contact with the template.

* * * * *